United States Patent
Smith et al.

(10) Patent No.: US 10,586,765 B2
(45) Date of Patent: Mar. 10, 2020

(54) BURIED POWER RAILS

(71) Applicant: Tokyo Electron Limited, Tokyo (JP)

(72) Inventors: Jeffrey Smith, Clifton Park, NY (US);
Anton J. Devilliers, Clifton Park, NY (US); Kandabara Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/011,377

(22) Filed: Jun. 18, 2018

(65) Prior Publication Data

US 2018/0374791 A1    Dec. 27, 2018

Related U.S. Application Data

(60) Provisional application No. 62/523,704, filed on Jun. 22, 2017.

(51) Int. Cl.
| | | |
|---|---|---|
| *H01L 23/528* | (2006.01) | |
| *H01L 21/768* | (2006.01) | |
| *H01L 21/762* | (2006.01) | |
| *H01L 29/06* | (2006.01) | |
| *H01L 23/532* | (2006.01) | |
| *H01L 21/8238* | (2006.01) | |
| *H01L 21/822* | (2006.01) | |
| *H01L 29/78* | (2006.01) | |
| *H01L 21/74* | (2006.01) | |
| *H01L 27/06* | (2006.01) | |
| *H01L 27/092* | (2006.01) | |

(Continued)

(52) U.S. Cl.
CPC .......... *H01L 23/528* (2013.01); *H01L 21/743* (2013.01); *H01L 21/76224* (2013.01); *H01L 21/76802* (2013.01); *H01L 21/76879* (2013.01); *H01L 21/76897* (2013.01); *H01L 21/8221* (2013.01); *H01L 21/823871* (2013.01); *H01L 23/5286* (2013.01); *H01L 23/53257* (2013.01); *H01L 27/0688* (2013.01); *H01L 27/092* (2013.01); *H01L 29/0649* (2013.01); *H01L 29/785* (2013.01); *H01L 21/823807* (2013.01); *H01L 21/823814* (2013.01); *H01L 29/0673* (2013.01); *H01L 29/66439* (2013.01); *H01L 29/775* (2013.01)

(58) Field of Classification Search
CPC .................. H01L 21/76224; H01L 29/785
USPC ........................................................ 257/508
See application file for complete search history.

(56) References Cited

U.S. PATENT DOCUMENTS 7,082,052 B2    7/2006 Rinerson et al.
7,368,365 B2    5/2008 Wells
(Continued)

OTHER PUBLICATIONS

International Search Report and Written Opinion dated Oct. 12, 2016 in PCT/US2018/038678, 17 pages.

*Primary Examiner* — Igwe U Anya
(74) *Attorney, Agent, or Firm* — Oblon, McClelland, Maier & Neustadt, L.L.P.

(57) ABSTRACT

Aspects of the disclosure provide a semiconductor device and a method for manufacturing the semiconductor device. The semiconductor device includes a power rail formed in an isolation trench. The power rail is covered by a dielectric cap that isolates the power rail from conductive pattern structures on the dielectric cap. Further, an opening is selectively formed in the dielectric cap and is filled with conductive material to selectively connect a conductive pattern structure with the power rail.

20 Claims, 39 Drawing Sheets

(51) Int. Cl.
    *H01L 29/775* (2006.01)
    *H01L 29/66* (2006.01)

(56) References Cited

U.S. PATENT DOCUMENTS

| | | |
|---|---|---|
| 7,394,679 B2 | 7/2008 | Rinerson et al. |
| 7,538,338 B2 | 5/2009 | Rinerson et al. |
| 7,633,790 B2 | 12/2009 | Rinerson et al. |
| 7,889,539 B2 | 2/2011 | Rinerson et al. |
| 7,889,571 B2 | 2/2011 | Norman |
| 7,892,919 B2 | 2/2011 | Kim et al. |
| 7,897,951 B2 | 3/2011 | Rinerson et al. |
| 7,960,242 B2 | 6/2011 | Or-Bach et al. |
| 7,964,916 B2 | 6/2011 | Or-Bach et al. |
| 7,985,963 B2 | 7/2011 | Rinerson et al. |
| 7,986,042 B2 | 7/2011 | Or-Bach et al. |
| 7,986,567 B2 | 7/2011 | Norman |
| 8,003,511 B2 | 8/2011 | Rinerson et al. |
| 8,020,132 B2 | 9/2011 | Norman |
| 8,026,521 B1 | 9/2011 | Or-Bach et al. |
| 8,027,215 B2 | 9/2011 | Lambertson et al. |
| 8,031,509 B2 | 10/2011 | Schloss et al. |
| 8,056,137 B2 | 11/2011 | Or-Bach et al. |
| 8,062,942 B2 | 11/2011 | Rinerson et al. |
| 8,111,572 B2 | 2/2012 | Norman |
| 8,115,511 B2 | 2/2012 | Or-Bach |
| 8,139,409 B2 | 3/2012 | Chevallier et al. |
| 8,141,021 B2 | 3/2012 | Norman |
| 8,148,728 B2 | 4/2012 | Or-Bach et al. |
| 8,153,499 B2 | 4/2012 | Or-Bach et al. |
| 8,163,581 B1 | 4/2012 | Or-Bach et al. |
| 8,164,960 B2 | 4/2012 | Norman |
| 8,203,148 B2 | 6/2012 | Sekar et al. |
| 8,237,142 B2 | 8/2012 | Cheung et al. |
| 8,237,228 B2 | 8/2012 | Or-Bach et al. |
| 8,254,196 B2 | 8/2012 | Lambertson et al. |
| 8,258,810 B2 | 9/2012 | Or-Bach et al. |
| 8,264,864 B2 | 9/2012 | Meyer |
| 8,268,667 B2 | 9/2012 | Rinerson et al. |
| 8,270,193 B2 | 9/2012 | Siau et al. |
| 8,273,610 B2 | 9/2012 | Or-Bach et al. |
| 8,294,159 B2 | 10/2012 | Or-Bach et al. |
| 8,298,875 B1 | 10/2012 | Or-Bach et al. |
| 8,305,796 B2 | 11/2012 | Chevallier et al. |
| 8,314,024 B2 | 11/2012 | Rinerson et al. |
| 8,320,161 B2 | 11/2012 | Rinerson et al. |
| 8,347,254 B2 | 1/2013 | Norman |
| 8,358,529 B2 | 1/2013 | Schloss et al. |
| 8,362,482 B2 | 1/2013 | Or-Bach et al. |
| 8,362,800 B2 | 1/2013 | Or-Bach et al. |
| 8,363,443 B2 | 1/2013 | Chevallier et al. |
| 8,373,230 B1 | 2/2013 | Or-Bach et al. |
| 8,373,439 B2 | 2/2013 | Or-Bach |
| 8,378,494 B2 | 2/2013 | Or-Bach et al. |
| 8,378,715 B2 | 2/2013 | Or-Bach et al. |
| 8,384,426 B2 | 2/2013 | Or-Bach |
| 8,390,100 B2 | 3/2013 | Bornstein |
| 8,395,191 B2 | 3/2013 | Or-Bach et al. |
| 8,405,420 B2 | 3/2013 | Or-Bach et al. |
| 8,419,345 B2 | 4/2013 | Arnett et al. |
| 8,427,200 B2 | 4/2013 | Or-Bach |
| 8,427,868 B2 | 4/2013 | Chevallier et al. |
| 8,450,804 B2 | 5/2013 | Sekar et al. |
| 8,461,035 B1 | 6/2013 | Cronquist et al. |
| 8,476,145 B2 | 7/2013 | Or-Bach et al. |
| 8,492,886 B2 | 7/2013 | Or-Bach et al. |
| 8,536,023 B2 | 9/2013 | Or-Bach et al. |
| 8,541,819 B1 | 9/2013 | Or-Bach et al. |
| 8,559,209 B2 | 10/2013 | Siau |
| 8,565,003 B2 | 10/2013 | Siau |
| 8,565,006 B2 | 10/2013 | Schloss et al. |
| 8,565,039 B2 | 10/2013 | Lambertson et al. |
| 8,569,160 B2 | 10/2013 | Rinerson et al. |
| 8,561,349 B2 | 11/2013 | Sekar et al. |
| 8,588,005 B2 | 11/2013 | Norman |
| 8,611,130 B2 | 12/2013 | Rinerson et al. |
| 8,642,416 B2 | 2/2014 | Or-Bach et al. |
| 8,654,565 B2 | 2/2014 | Chevallier et al. |
| 8,664,042 B2 | 3/2014 | Or-Bach et al. |
| 8,669,778 B1 | 3/2014 | Or-Bach et al. |
| 8,675,389 B2 | 3/2014 | Chevallier et al. |
| 8,703,597 B1 | 4/2014 | Sekar et al. |
| 8,705,260 B2 | 4/2014 | Chevallier et al. |
| 8,709,880 B2 | 4/2014 | Or-Bach et al. |
| 8,742,476 B1 | 6/2014 | Or-Bach et al. |
| 8,753,913 B2 | 6/2014 | Or-Bach et al. |
| 8,754,533 B2 | 6/2014 | Or-Bach et al. |
| 8,823,122 B2 | 9/2014 | Or-Bach et al. |
| 8,846,463 B1 | 9/2014 | Or-Bach et al. |
| 8,848,425 B2 | 9/2014 | Schloss et al. |
| 8,854,881 B2 | 10/2014 | Chevallier et al. |
| 8,897,050 B2 | 11/2014 | Siau et al. |
| 8,901,613 B2 | 12/2014 | Sekar et al. |
| 8,907,442 B2 | 12/2014 | Or-Bach et al. |
| 8,912,052 B2 | 12/2014 | Or-Bach |
| 8,929,126 B2 | 1/2015 | Siau |
| 8,937,292 B2 | 1/2015 | Bateman |
| 8,956,959 B2 | 2/2015 | Sekar et al. |
| 8,975,670 B2 | 3/2015 | Or-Bach et al. |
| 8,987,079 B2 | 3/2015 | Or-Bach |
| 8,988,930 B2 | 3/2015 | Chevallier et al. |
| 8,993,385 B1 | 3/2015 | Or-Bach et al. |
| 9,030,889 B2 | 5/2015 | Norman |
| 9,058,300 B2 | 6/2015 | Norman |
| 9,099,424 B1 | 8/2015 | Sekar et al. |
| 9,099,526 B2 | 8/2015 | Or-Bach et al. |
| 9,129,668 B2 | 9/2015 | Chevallier et al. |
| 9,136,153 B2 | 9/2015 | Or-Bach et al. |
| 9,159,408 B2 | 10/2015 | Chevallier et al. |
| 9,159,913 B2 | 10/2015 | Rinerson et al. |
| 9,197,804 B1 | 11/2015 | Or-Bach et al. |
| 9,219,005 B2 | 12/2015 | Or-Bach et al. |
| 9,293,702 B2 | 3/2016 | Schloss et al. |
| 9,299,427 B2 | 3/2016 | Chevallier et al. |
| 9,299,641 B2 | 3/2016 | Sekar et al. |
| 9,312,307 B2 | 4/2016 | Bateman |
| 9,378,825 B2 | 5/2016 | Norman |
| 9,384,806 B2 | 7/2016 | Chevallier et al. |
| 9,385,088 B2 | 7/2016 | Or-Bach et al. |
| 9,401,202 B2 | 7/2016 | Siau |
| 9,406,670 B1 | 8/2016 | Or-Bach et al. |
| 9,412,645 B1 | 8/2016 | Or-Bach et al. |
| 9,419,031 B1 | 8/2016 | Or-Bach et al. |
| 9,455,343 B2 | 9/2016 | Pillarisetty et al. |
| 9,484,533 B2 | 11/2016 | Wu et al. |
| 9,502,414 B2 | 11/2016 | Machkaoutsan et al. |
| 9,509,313 B2 | 11/2016 | Or-Bach et al. |
| 9,514,811 B2 | 12/2016 | Chevallier et al. |
| 9,564,432 B2 | 2/2017 | Or-Bach et al. |
| 9,570,515 B2 | 2/2017 | Chevallier et al. |
| 9,577,642 B2 | 2/2017 | Or-Bach et al. |
| 9,613,844 B2 | 4/2017 | Or-Bach et al. |
| 9,613,887 B2 | 4/2017 | Sekar et al. |
| 9,691,821 B2 | 6/2017 | Bateman |
| 9,711,407 B2 | 7/2017 | Or-Bach et al. |
| 9,715,910 B2 | 7/2017 | Norman |
| 9,720,611 B2 | 8/2017 | Siau |
| 9,767,897 B2 | 9/2017 | Schloss et al. |
| 9,767,899 B2 | 9/2017 | Chevallier et al. |
| 9,806,130 B2 | 10/2017 | Chevallier et al. |
| 9,818,799 B2 | 11/2017 | Wu et al. |
| 9,818,800 B2 | 11/2017 | Sekar et al. |
| 9,824,936 B2 | 11/2017 | Machkaoutsan et al. |
| 9,825,095 B2 | 11/2017 | Pillarisetty et al. |
| 9,831,425 B2 | 11/2017 | Rinerson et al. |
| 9,853,089 B2 | 12/2017 | Or-Bach et al. |
| 9,870,809 B2 | 1/2018 | Chevallier et al. |
| 9,887,203 B2 | 2/2018 | Or-Bach et al. |
| 9,892,972 B2 | 2/2018 | Or-Bach et al. |
| 9,941,319 B2 | 4/2018 | Or-Bach et al. |
| 9,941,332 B2 | 4/2018 | Or-Bach et al. |
| 9,953,925 B2 | 4/2018 | Or-Bach et al. |
| 9,953,972 B2 | 4/2018 | Sekar et al. |
| 10,109,646 B1 * | 10/2018 | Badaroglu ........ H01L 27/11807 |

(56) References Cited

U.S. PATENT DOCUMENTS

| | | | |
|---|---|---|---|
| 10,170,318 B2 * | 1/2019 | Tang | H01L 21/02211 |
| 2005/0174835 A1 | 8/2005 | Rinerson et al. | |
| 2006/0050598 A1 | 3/2006 | Rinerson et al. | |
| 2006/0171200 A1 | 8/2006 | Rinerson et al. | |
| 2006/0245243 A1 | 11/2006 | Rinerson et al. | |
| 2008/0109775 A1 | 5/2008 | Norman | |
| 2008/0293196 A1 | 11/2008 | Rinerson et al. | |
| 2009/0026442 A1 | 1/2009 | Cheung et al. | |
| 2009/0045390 A1 | 2/2009 | Rinerson et al. | |
| 2009/0098740 A1 | 4/2009 | Kim et al. | |
| 2009/0154232 A1 | 6/2009 | Norman | |
| 2009/0177833 A1 | 7/2009 | Norman | |
| 2009/0204777 A1 | 8/2009 | Norman | |
| 2009/0231906 A1 | 9/2009 | Rinerson et al. | |
| 2009/0303772 A1 | 12/2009 | Rinerson et al. | |
| 2009/0303773 A1 | 12/2009 | Rinerson et al. | |
| 2010/0155722 A1 | 6/2010 | Meyer | |
| 2010/0155953 A1 | 6/2010 | Bornstein | |
| 2010/0157657 A1 | 6/2010 | Rinerson et al. | |
| 2010/0157658 A1 | 6/2010 | Schloss et al. | |
| 2010/0157710 A1 | 6/2010 | Lambertson et al. | |
| 2010/0159641 A1 | 6/2010 | Rinerson et al. | |
| 2010/0159688 A1 | 6/2010 | Rinerson et al. | |
| 2010/0215483 A1 | 8/2010 | Arnett et al. | |
| 2010/0259296 A1 | 10/2010 | Or-Bach | |
| 2010/0289064 A1 | 11/2010 | Or-Bach et al. | |
| 2010/0291749 A1 | 11/2010 | Or-Bach et al. | |
| 2010/0295136 A1 | 11/2010 | Or-Bach et al. | |
| 2011/0031997 A1 | 2/2011 | Or-Bach et al. | |
| 2011/0037497 A1 | 2/2011 | Or-Bach | |
| 2011/0049577 A1 | 3/2011 | Or-Bach et al. | |
| 2011/0084314 A1 | 4/2011 | Or-Bach et al. | |
| 2011/0092030 A1 | 4/2011 | Or-Bach et al. | |
| 2011/0108888 A1 | 5/2011 | Or-Bach et al. | |
| 2011/0121366 A1 | 5/2011 | Or-Bach et al. | |
| 2011/0141831 A1 | 6/2011 | Norman | |
| 2011/0155990 A1 | 6/2011 | Cheung et al. | |
| 2011/0186803 A1 | 8/2011 | Rinerson et al. | |
| 2011/0188281 A1 | 8/2011 | Siau et al. | |
| 2011/0188283 A1 | 8/2011 | Chevallier et al. | |
| 2011/0188284 A1 | 8/2011 | Chevallier et al. | |
| 2011/0188289 A1 | 8/2011 | Chevallier et al. | |
| 2011/0199116 A1 | 8/2011 | Or-Bach et al. | |
| 2011/0233617 A1 | 9/2011 | Or-Bach et al. | |
| 2011/0233676 A1 | 9/2011 | Or-Bach et al. | |
| 2011/0278532 A1 | 11/2011 | Rinerson et al. | |
| 2011/0280060 A1 | 11/2011 | Norman | |
| 2011/0310658 A1 | 12/2011 | Norman | |
| 2011/0315943 A1 | 12/2011 | Rinerson et al. | |
| 2011/0315948 A1 | 12/2011 | Rinerson et al. | |
| 2012/0012895 A1 | 1/2012 | Or-Bach et al. | |
| 2012/0020143 A1 | 1/2012 | Lambertson et al. | |
| 2012/0026780 A1 | 2/2012 | Schloss et al. | |
| 2012/0028436 A1 | 2/2012 | Or-Bach et al. | |
| 2012/0032294 A1 | 2/2012 | Or-Bach et al. | |
| 2012/0033481 A1 | 2/2012 | Rinerson et al. | |
| 2012/0043521 A1 | 2/2012 | Schloss et al. | |
| 2012/0064691 A1 | 3/2012 | Rinerson et al. | |
| 2012/0086067 A1 | 4/2012 | Sekar et al. | |
| 2012/0087174 A1 | 4/2012 | Rinerson et al. | |
| 2012/0088355 A1 | 4/2012 | Sekar et al. | |
| 2012/0091587 A1 | 4/2012 | Or-Bach et al. | |
| 2012/0107967 A1 | 5/2012 | Or-Bach et al. | |
| 2012/0129301 A1 | 5/2012 | Or-Bach et al. | |
| 2012/0156868 A1 * | 6/2012 | Kim | H01L 27/10876 |
| | | | 438/589 |
| 2012/0176832 A1 | 7/2012 | Chevallier et al. | |
| 2012/0176840 A1 | 7/2012 | Norman | |
| 2012/0193621 A1 | 8/2012 | Or-Bach et al. | |
| 2012/0193681 A1 | 8/2012 | Or-Bach | |
| 2012/0193719 A1 | 8/2012 | Or-Bach et al. | |
| 2012/0193806 A1 | 8/2012 | Or-Bach et al. | |
| 2012/0194216 A1 | 8/2012 | Or-Bach et al. | |
| 2012/0194218 A1 | 8/2012 | Or-Bach et al. | |
| 2012/0196390 A1 | 8/2012 | Or-Bach et al. | |
| 2012/0196409 A1 | 8/2012 | Or-Bach | |
| 2012/0206980 A1 | 8/2012 | Norman | |
| 2012/0220102 A1 | 8/2012 | Or-Bach et al. | |
| 2012/0220120 A1 * | 8/2012 | Kang | H01L 27/1052 |
| | | | 438/653 |
| 2012/0223436 A1 | 9/2012 | Sekar et al. | |
| 2012/0223738 A1 | 9/2012 | Or-Bach et al. | |
| 2012/0231572 A1 | 9/2012 | Or-Bach et al. | |
| 2012/0248595 A1 | 10/2012 | Or-Bach et al. | |
| 2012/0273955 A1 | 11/2012 | Or-Bach et al. | |
| 2012/0286232 A1 | 11/2012 | Lambertson et al. | |
| 2012/0292585 A1 | 11/2012 | Cheung et al. | |
| 2012/0306082 A1 | 12/2012 | Sekar et al. | 4/1 |
| 2012/0307542 A1 | 12/2012 | Siau et al. | |
| 2012/0313227 A1 | 12/2012 | Or-Bach et al. | |
| 2012/0314477 A1 | 12/2012 | Siau | |
| 2012/0322203 A1 | 12/2012 | Or-Bach et al. | |
| 2013/0003437 A1 | 1/2013 | Siau | |
| 2013/0020707 A1 | 1/2013 | Or-Bach et al. | |
| 2013/0021060 A1 | 1/2013 | Or-Bach et al. | |
| 2013/0043452 A1 | 2/2013 | Meyer et al. | |
| 2013/0043455 A1 | 2/2013 | Bateman | |
| 2013/0059436 A1 | 3/2013 | Rinerson et al. | |
| 2013/0069191 A1 | 3/2013 | Or-Bach et al. | |
| 2013/0082228 A1 | 4/2013 | Parrillo et al. | |
| 2013/0082232 A1 | 4/2013 | Wu et al. | |
| 2013/0119557 A1 | 5/2013 | Or-Bach et al. | |
| 2013/0122672 A1 | 5/2013 | Or-Bach et al. | |
| 2013/0135920 A1 | 5/2013 | Chevallier et al. | |
| 2013/0193488 A1 | 8/2013 | Or-Bach et al. | |
| 2013/0214233 A1 | 8/2013 | Schloss et al. | |
| 2013/0215667 A1 | 8/2013 | Chevallier et al. | |
| 2013/0229856 A1 | 9/2013 | Chevallier et al. | |
| 2014/0009998 A1 | 1/2014 | Schloss et al. | |
| 2014/0014893 A1 | 1/2014 | Lambertson et al. | |
| 2014/0140122 A1 | 5/2014 | Siau | |
| 2014/0145272 A1 | 5/2014 | Or-Bach et al. | |
| 2014/0198584 A1 | 7/2014 | Norman | |
| 2014/0211542 A1 | 7/2014 | Chevallier et al. | |
| 2014/0219006 A1 | 8/2014 | Chevallier et al. | |
| 2014/0346435 A1 | 11/2014 | Wu et al. | |
| 2014/0367629 A1 | 12/2014 | Schloss et al. | |
| 2015/0029780 A1 | 1/2015 | Rinerson et al. | |
| 2015/0055425 A1 | 2/2015 | Chevallier et al. | |
| 2015/0061036 A1 | 3/2015 | Or-Bach et al. | |
| 2015/0091067 A1 | 4/2015 | Pillarisetty et al. | |
| 2015/0097155 A1 | 4/2015 | Bateman | |
| 2015/0123072 A1 | 5/2015 | Sekar et al. | |
| 2015/0132917 A1 | 5/2015 | Siau et al. | |
| 2015/0138874 A1 | 5/2015 | Siau | |
| 2015/0179250 A1 | 6/2015 | Chevallier et al. | |
| 2015/0221377 A1 | 8/2015 | Norman | |
| 2015/0243748 A1 * | 8/2015 | Pulugurtha | H01L 29/7827 |
| | | | 257/330 |
| 2015/0249053 A1 | 9/2015 | Or-Bach et al. | |
| 2015/0311142 A1 | 10/2015 | Sekar et al. | |
| 2015/0348945 A1 | 12/2015 | Or-Bach et al. | |
| 2015/0364169 A1 | 12/2015 | Chevallier et al. | |
| 2015/0380642 A1 | 12/2015 | Rinerson et al. | |
| 2016/0005793 A1 | 1/2016 | Chevallier et al. | |
| 2016/0064439 A1 | 3/2016 | Or-Bach et al. | |
| 2016/0111369 A1 | 4/2016 | Or-Bach et al. | |
| 2016/0172025 A1 | 6/2016 | Chevallier et al. | |
| 2016/0204085 A1 | 7/2016 | Sekar et al. | |
| 2016/0267973 A1 | 9/2016 | Schloss et al. | |
| 2016/0300883 A1 | 10/2016 | Bateman | |
| 2016/0343774 A1 | 11/2016 | Or-Bach et al. | |
| 2016/0365385 A1 | 12/2016 | Pillarisetty et al. | |
| 2016/0379691 A1 | 12/2016 | Norman | |
| 2016/0379692 A1 | 12/2016 | Chevallier et al. | |
| 2017/0010831 A1 | 1/2017 | Siau | |
| 2017/0033020 A1 | 2/2017 | Machkaoutsan et al. | |
| 2017/0092541 A1 | 3/2017 | Or-Bach et al. | |
| 2017/0110514 A1 | 4/2017 | Wu et al. | |
| 2017/0133432 A1 | 5/2017 | Or-Bach et al. | |
| 2017/0140816 A1 | 5/2017 | Chevallier et al. | |
| 2017/0162585 A1 | 6/2017 | Or-Bach et al. | |
| 2017/0179155 A1 | 6/2017 | Or-Bach et al. | |
| 2017/0179197 A1 | 6/2017 | Chevallier et al. | |

(56) References Cited

U.S. PATENT DOCUMENTS

| | | |
|---|---|---|
| 2017/0186770 A1 | 6/2017 | Or-Bach et al. |
| 2017/0200715 A1 | 7/2017 | Sekar et al. |
| 2017/0364296 A1 | 12/2017 | Siau |
| 2018/0012934 A1 | 1/2018 | Bateman |
| 2018/0019008 A1 | 1/2018 | Norman |
| 2018/0019009 A1 | 1/2018 | Norman |
| 2018/0096726 A1 | 4/2018 | Chevallier et al. |
| 2018/0114573 A1 | 4/2018 | Schloss et al. |
| 2018/0122857 A1 | 5/2018 | Chevallier et al. |
| 2018/0130850 A1 | 5/2018 | Wu et al. |
| 2018/0130946 A1 | 5/2018 | Rinerson et al. |
| 2018/0294267 A1* | 10/2018 | Licausi ............ H01L 27/10879 |

* cited by examiner

BURIED POWER RAILS

PRIORITY CLAIM AND CROSS-REFERENCE

This present disclosure claims the benefit of U.S. Provisional Application No. 62/523,704, "Method to Self-align Buried Power Rails and Below-device Wiring for Random and Non-random Logic Applications and Designs" filed on Jun. 22, 2017, which is incorporated herein by reference in its entirety.

TECHNICAL FIELD

The present disclosure describes embodiments generally related to semiconductor devices and manufacturing process.

BACKGROUND

The present disclosure relates to a method of manufacturing a semiconductor device such as an integrated circuit and transistors and transistor components for an integrated circuit. In the manufacture of a semiconductor device (especially on the microscopic scale), various fabrication processes, such as film-forming depositions, etch mask creation, patterning, material etching and removal, as well as doping treatments, are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes.

SUMMARY

This invention pertains to device fabrication of both random and non-random logic incorporating either fin field effect transistor (FINFET), nanowires, nanosheets, or complementary stacked nanowires and/or nanosheets. Within standard logic cells, power to the devices (e.g., transistors) is supplied to the source/drain contacts through power rails in back-end of line (BEOL) metal layers. The power rails typically run across adjacent cells in an orientation that is typical referred to as east-west orientation. Since the power rails need to supply power to a number of cells, the power rails are often implemented with much larger sizes (e.g., larger width) compared to standard routing tracks/signal lines that are used within the cells. Typically the size difference of the power rail compared to a normal routing line can be as large as 3 to 4 times, thus the power rails utilize significant amount of area within the cell design. The larger critical dimension of the power rails is needed in order to maintain an adequate resistance through the rail in order to maintain adequate power distribution targets including IR drop and frequency of which the power rails need to be supplied within the device.

An approach has been devised to reduce the lateral (width) size of the power rails through making them deeper (e.g. higher aspect ratio) in size in order to allow a smaller top-down cross-section (e.g., smaller width metal lines) while effectively keeping the total metal volume in the power rail either the same or increased. The increase in aspect ratio provides for lower resistance across the power rail which provides the ability to maintain improved IR drop and frequency of which the power rail needs to be supplied. Simply increasing the aspect ratio of the power rail in the BEOL is often difficult as it would drive larger aspect-ratio vias to connect signal lines to the device (e.g. higher via resistance), or would require the signal lines to also have similar aspect ratio which would cause increased capacitance between tracks in the BEOL. One approach includes "burying" or positioning the power rails underneath a physical device (e.g. transistor), where the aspect ratio of the power rail can be increased independent of the signal lines in the BEOL, this providing a means to significantly lower resistance through the power rail without driving any negative impact to either via resistance or capacitance in the BEOL. In this method, power is supplied to the metal contacts through a bottom-up approach as opposed through the conventional pull-down approach.

Burying the power rail under the physical device allows cell footage reduction. For example, generally cells are realized as fixed-height, variable-width cells in standard cell layout library. The fixed height enables cells to be placed in rows, and eases the process of automated layout design. The row direction is the orientation that is referred to as east-west orientation, and a direction that is perpendicular to the east-west orientation is referred to as north-south orientation. With this naming convention, M0 would typically contain lines running in an east-west orientation while M1 would have lines running in a north-south orientation. Subsequent metal layers would run perpendicular with respect to the preceding metal layers.

Burying the power rail under the physical device allows for the cell height of the standard cell to be defined solely by the number of routing tracks or signal lines as opposed to a combination of power rails and routing tracks. This provides the ability to scale easily down from a 6.0 to 6.5 routing tracks (6.5 T) cell height (assuming either a power rail width equal to either 2 or 3 times that of a routing track line) to a 5.0 routing track cell height through incorporation of this concept, even if the number of actual routing tracks are the same.

Connections to either Vss or Vdd from neighboring cells (in the north-south direction) can be done along a common power rail. In an example, a power rail (e.g., Vdd) is located underneath between an upper row of standard cells and a lower row of standard cells. The power rail runs in the east-west orientation. The cells in the upper row are north-facing, and the cells in the lower row are southern-facing, and can use commonly the power rail as Vdd power supply for example. The power rail can be tapped by the north-facing cells in the upper row and can likewise be tapped by the adjacent southern-facing cells in the lower row. For the case of a large non-buried rail, this can be accommodated since there is adequate space on the rail to make both connections, and those connections are done from a top-down integration approach where a via is transferred through the rail to the metal drain (such as a channel or a tunnel for metallization) underneath. Accordingly, any alignment done in either the lithography or patterning will be directly transferred by the etch process. Regarding the embodiment of a buried rail, however, the power rail can be encased either within the shallow-trench isolation (STI) or within the bulk silicon and STI together, depending on how large of an aspect ratio is necessary to meet resistance specifications. Making a connection down through the oxide fill of the replacement metal drain and landing on the metal rail and not the STI physically adjacent to the rail can be difficult to execute. Any placement error would result in additional metal fill of the rail since the next steps of the process would be to metalize the metal drain after making connection to the buried rail. Conversely, any placement error where inadequate connection is made to the power rail provides a significant resistance penalty, especially in designs in which the connection between rail and metal drain is less than 12 nm in size.

For cases where two source/drain contacts from two neighboring cells in the north-south orientation are pulling down from a common power rail, the source/drain contacts or electrodes between both standard cells can actually be shared which enables the placement of the via connecting to (a) be increased in diameter in order to improve via resistance, and (b) placed any place within the width of the power rail, thus providing some edge-placement error (EPE) relief.

Several additional, challenges arise with the integration of burying power rails underneath the active device. These problems are also affected by several factors including the size of the rail to be used, location in the integration process sequence that the buried rail is to be implemented, the placement of the buried power rails in proximity to silicon or SiGe fin structures (or Si/SiGe fin superlattice used in the nanosheet gate-all-around (GAA) process), density and location of where these rails are tapped (both within a single standard cell as well as between two adjacent cells in the north-south orientation), the metal used for the buried rail along with any associated liners required for metallization of the rail and its subsequent connection to the metal drain, and thermal restrictions of how and where in the integration the buried power rail is created.

Example embodiments herein primarily focus on describing application for buried power rails. This application is non-limiting though. Embodiments herein can be extended to cover any back-side wiring such as routing lines or local interconnect or cell-to-cell interconnect lines that exist below the physical device, as well as buried power distribution networks supplying the power rails directly from the back of the wafer.

Currently there is no method to self-align any wiring done on the bottom-end of the physical device. This is regardless of whether the wiring includes buried power rails, buried wordline for memory, buried interconnect lines, buried routing lines, buried inter-cell wiring lines for logic, et cetera.

Enabling the multiple method of self-alignment as disclosed herein provides the ability to significantly scale cell height for logic designs from current 6.5 T down to 5 T or even further below, if implemented in conjunction with other scaling concepts such as complementary FET stacked nanosheet architectures, in which 4 T or even 3 T cell heights would be feasible with buried power rails. This also eventually provides a mechanism in which cells themselves can be stacked overtop of one another. In some examples, complementary stacked nano-sheets (PMOS over NMOS) are disclosed. Such stacked devices can be used with embodiments herein of buried back-side wiring to extend to multiple cell stacking where placement or wires and/or other wiring can be done either below a physical device, in-between multiple physical devices, as well as above a physical device, as is currently the method for metallization.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Aspects of the disclosure provide a semiconductor device. The semiconductor device includes a power rail formed in an isolation trench and optionally extending down into the bulk silicon. The power rail is covered by a dielectric cap or with a second deposition of STI oxide to isolate the power rail from the HKMG (high-k metal gate), gate electrodes, and even source/drain electrodes. Further, an opening can be formed in the dielectric cap and filled with conductive material to selectively connect a source/drain electrode with the power rail.

Aspects of the disclosure provide a method for manufacturing a semiconductor device. The method includes forming, in an isolation trench and optionally extending down into the bulk silicon, a power rail. Further, the method includes top-covering the power rail with a dielectric cap to isolate the power rail from conductive pattern structures on the dielectric cap. Then, the method includes selectively forming an opening in the dielectric cap and filling the opening with conductive material to selectively connect a conductive pattern structure with the power rail through the filled opening. The dielectric cap material can be different from the surrounding STI oxide in order to provide some means of self-alignment through etch selectively when forming via structures which will connect the power rail to the source/drain electrode. The deposition of this capping material can be done through either (a) conventional fill, CMP, and recess process, or more-preferably, through (b) a selective deposition process in which the cap material is selectively deposited on the upper surface of the buried metal rail.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
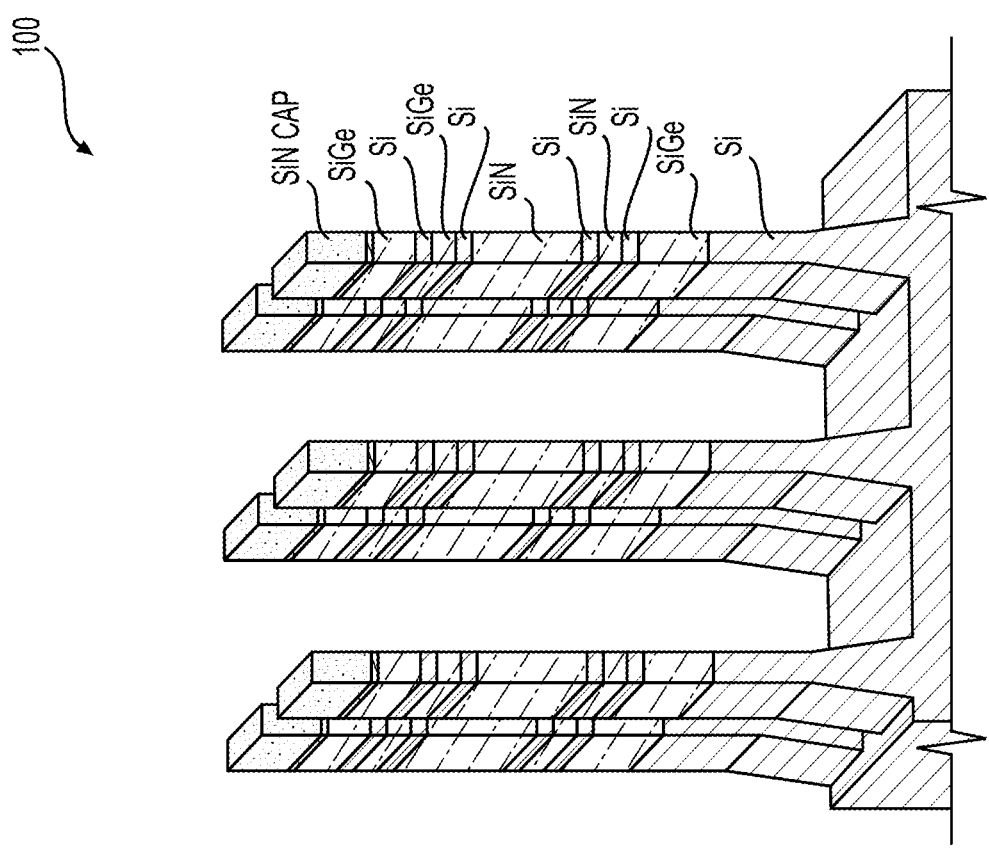
FIGS. 1-20 show various schematic views of intermediate stages during a semiconductor manufacturing process according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosures herein provide for the method of self-aligning buried power rails for both random and non-random logic cells. The buried power rail has multiple locations for insertion into a given logic integration flow: (a) directly on the bulk silicon for a standard fin field effect transistor (FINFET) process; (b) directly on SiGe epitaxy film above bulk silicon for SiGe P-type metal-oxide-semiconductor (PMOS) channel process; (c) directly on a Si/SiGe multi-layer stack for nanowire and/or nanosheet processing; or (d) after the FINFET or Si/SiGe FIN stack has been patterned and filled in with STI oxide.

General, dummy FIN patterns are added in layout to uniform pattern density in order form uniform processing environment. During processing, for example, the dummy FIN patterns are removed at certain time to create room for or define the spaces where isolation regions will ultimately be formed to separate the individual FinFET devices from one another. The dummy FIN pattern removal is referred to as FIN cut. The dummy FIN pattern removal can happen before the FIN etch process, for example by removing dummy patterns in a hard mask layer for masking FIN etch, which is referred to as CUT-first approach. The dummy FIN pattern removal can happen in the middle of the FIN etch process, which is referred to as CUT-middle approach. The dummy FIN pattern removal can happen after FIN formation, which is referred to as CUT-last approach. CUT-last approach can improve process uniformity.

For the case of forming the buried rails for applications (a), (b), and (c), the rail can be patterned and etched to a fixed distance prior to any patterning of Si, SiGe, or stacked Si/SiGe FINs. Thus, the full rail depth will be transferred during the FIN etch process, such as in a similar manner as dual damascene method for beck end of line (BEOL). This approach can cause FIN etch processes to be done either CUT-middle or CUT-first, and not CUT-last as is currently favored by semiconductor manufacturers for advanced technology.

The FIN CUT-last approach can distort the depth and shape of the buried rail. Like-wise for the case of forming deep but narrow rails, which will be important to maintain resistance control, this may leave deep trenches with very limited space between them adjacent to patterned fins, which may cause some distortion in the physical power rail size and/or shape, which may have equally concerning issues for electrical parameters. Additionally for the case of FINFET applications, the bulk silicon, after the formation of the power rail and adjacent FINs, may be subject to a number of implantation steps, and it will be difficult to control the implant nature into the region bordering the rail etched within the bulk silicon. Such integration schemes are possible and have just been described, but would have some limitations in implementation. For option (d) in which the buried rail is patterned after FIN etch and STI fill/CMP, this is the preferred embodiment for incorporation of buried power rail.

In this embodiment, the buried rail is patterned on top of the STI oxide and transferred through the STI oxide, either stopping well within the depth of the STI oxide, or completely through the depth of the STI oxide and extending into the bulk silicon. The ultimate depth of the power rail into the bulk silicon will be dependent on the desired aspect ratio of the buried rail, and is usually defined by the choice of metal used and the required resistance of the buried power rail in order to meet power-distribution network specifications such as IR drop, frequency of contacting and supplying power to the rails, and design rule compliance for the frequency of supplying power to the rails and impact of routing upper metal layers based on this frequency and its impact on area scaling from a routing perspective. For the case of a wide (1.5 T to 4 T wide rail compared to a routing line) power rail the aspect ratio of this trench is on the order 2.5 to 5.0. A deep and narrow rail, which may have additional benefits, will have up to 3× the aspect ratio, or 7.5 to 15.0. This etch process will produce a very thin (<12 nm) STI oxide that can be as deep as the intended depth of the buried power rail within the STI. The challenges with transferring these narrow trenches within the oxide filling between the FINs include topple margin and distortion of the spacing between the buried power rails, which is critical for parasitics.

In some embodiments, a narrow buried rail can be formed, through a self-alignment process. For example, an initial trench of the size of 1.5 T to 4 T power rail is etched through the STI. Once the intended depth of the buried power rail is reached, an etch-selective film can be conformally deposited within the trench to form a "spacer" on both sides of the trench. This etch-selective material can then go through a normal "spacer-open" etch to remove the conformal deposition at the very bottom of the trench, leaving only etch-selective materials along the side-wall of the wide trench. Oxide or other dielectric liner and/or fill material can then be selected to fill in the remainder of the trench and is then planarized (such as by CMP) or dry-or-wet recessed down to expose an "A/B" matrix where A is STI oxide or fill oxide and B is the etch selective material within the trench. A non-aggressive etch process can then be used to exhume the etch-selective material "B" which will cause two identical trenched to be formed. The two trenches will be identical since they were both originally formed through a single conformal deposition process. There are multiple low-aggressive etch processes which will prevent the oxide between the two adjacent narrow trenches to collapse. One such process is chemical oxide removal (COR) vapor-phase etch in which selectivities up to a hundred to one can be achieved, as well as other quasi Atomic Layer Etching (ALE) and wet and or dry etches.

Once the self-aligned trenches are formed to produce adjacent buried rails, the power rails can then be metalized.

The choice of metallization for buried power rails affects where in the integration flow the rail is formed and metalized. For the case of forming and metalizing the buried rails well before spike-anneal on S/D epi is executed, the metal need to have very good thermal characteristics on oxide. For example, the metal should be able to be stable under spike anneal temperatures, which can range between 700 C and 1100 C, as well as any deposition temperatures of films to be used in the metal gate. For the embodiment in which the buried rail is placed before metal gate deposition and S/D spike anneals, this would preclude the use of metals such as copper (<450 C thermal stability), cobalt, or aluminum. In some embodiments, ruthenium is selectable for metalizing a buried power rail at this point in the integration given that it has excellent thermal stability over oxide, and can also be deposited into the deep trench using a bottom-up deposition process.

According to an aspect of the disclosure, techniques herein include bottom-up self-alignment of the power rail to the metal drain by using an etch-selective cap over the recessed ruthenium (or any other metal). In some embodiments, the cap is formed using a selective deposition process to deposit dielectric on metal (DoM). For the case of ruthenium, the cap can be (a) dielectric and have adequate size to be a true dielectric between the power rail and metal drain located above the rail, or (b) etch-selective to the bordering STI oxide or dielectric liner, (c) dielectric between the power rail and any over-hanging gate electrode, and (d) that the height of the dielectric cap will in effect define the ultimate placement of the HKMG and gate electrode with respect to the top of the buried power rail, and that this deposition amount can be controlled in order to control capacitance between the power rails and the gate electrode. The incorporation of the etch-selectivity nature of the cap ensures that when the metal drain is opened, that a self-aligned etch process can be employed in which the cap can be opened without further opening the STI oxide along the axis of the buried rail as the physical separation between the buried power rail and any silicon or Si/SiGe fin structure must also be well controlled. This also enables the full metal drain to open the cap to the buried power rail and control the tap to be the same identical size of the initial buried rail trench, which is also identical to the size of the buried power rail itself minus further deposited liners within the trench. This allows for complete freedom of the size of the metal drain to be used, which is beneficial for area-scaled devices where pin access is limited.

For detailed description of some embodiments herein, the metal filling is considered to be executed after the FIN etch and subsequent to the final STI fill, and polished down to the top of the fin structures. Although example embodiments focus on buried power rails, techniques herein can be extended to cover any back-side wiring such as routing lines or local interconnect or cell-to-cell interconnect lines that exist below the physical device.

Example embodiments below illustrate process flow for a complementary stacked nanosheet device (CFET). Note that the integration process flow is similar for use with fabrication of FINFET, laterally stacked nanowires and/or nanosheet, and SiGe channel FINFET devices.

A semiconductor process that uses the bottom-up self-alignment of the power rail to the metal drain by using an etch-selective cap over the recessed ruthenium is described with reference to FIG. 1-FIG. 14.

FIG. 1 shows a schematic view of a portion of a semiconductor device 100 during a semiconductor manufacturing process according to some embodiments. In the FIG. 1 example, the Si/SiGe FIN etch has been completed and a Pad oxide/SiN cap is left on the top of the FIN. In this particular situation, the FIN cut has already been done prior to the FIN etch process. This means that the silicon underneath the STI is considered to be "flat" in the areas between FINs. With a FINCUT-last approach, dummy FINs are etched before this step which provides deep recesses within the silicon between FINs which makes forming buried power rails more problematic. Thus, incorporating a FIN-CUT-first or FINCUT-middle approach for FIN pattern definition is preferred for incorporating buried power rail into this example integration. The following figure shows an example result.

Figure 2:
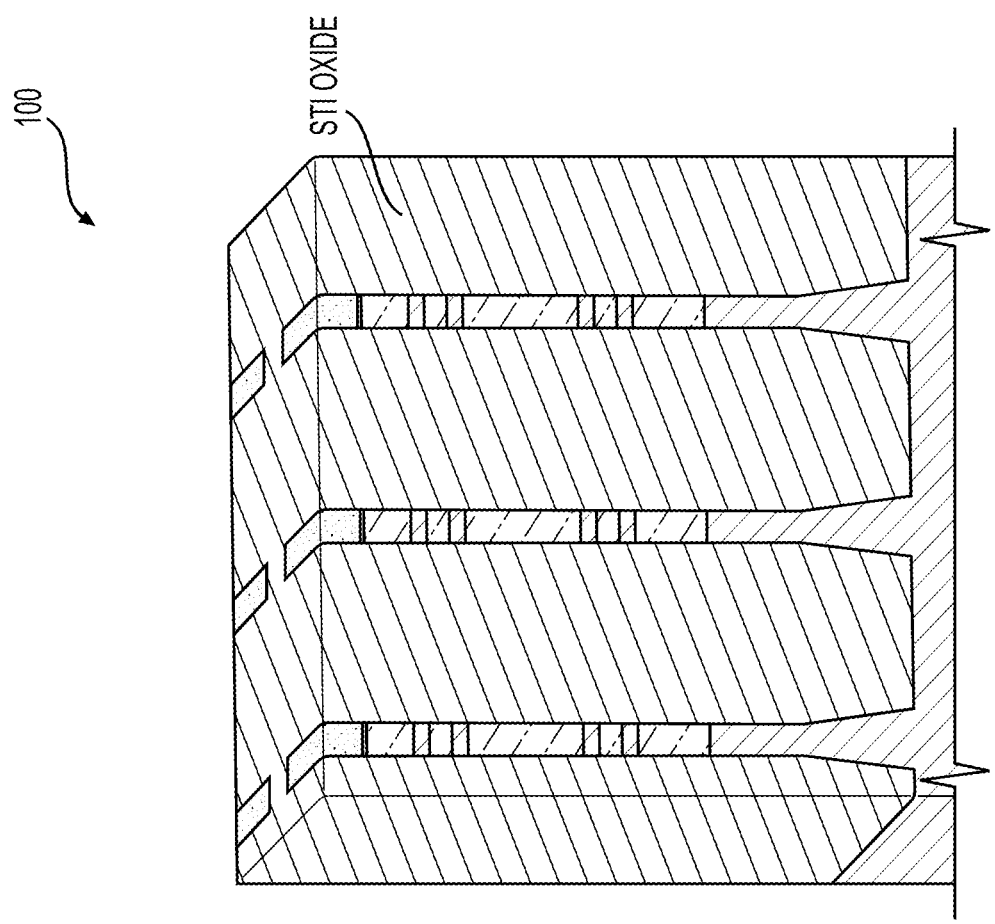

FIG. 2 shows a schematic view of the semiconductor device 100 after shallow trench isolation (STI) is done through deposition of oxide and CMP-back to the top of the Si/SiGe FIN structure.

Figure 3:
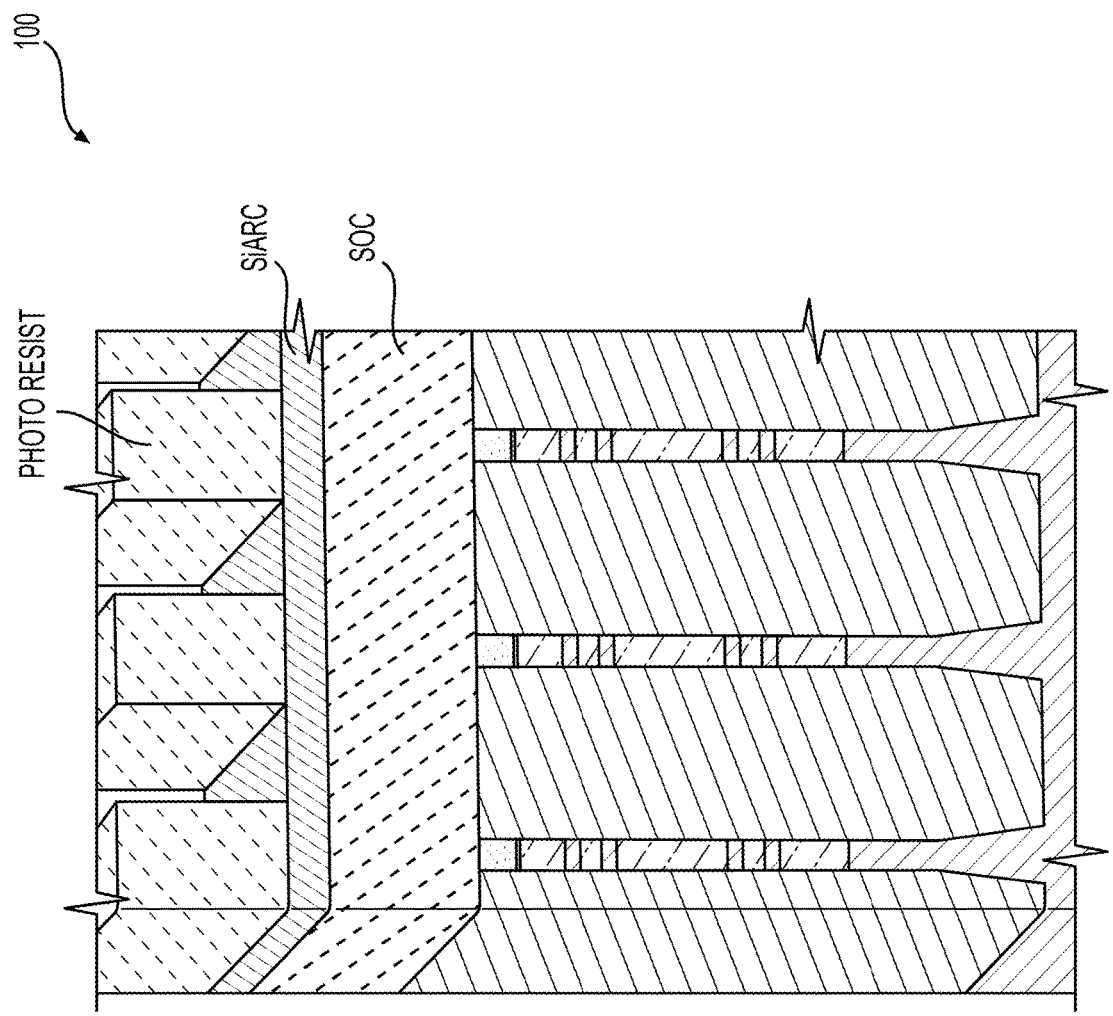

FIG. 3 shows a schematic view of the semiconductor device 100 after generating patterns for rail trench in a photoresist layer. In the FIG. 3 example, the a multi-layer photolithography stack is used for pattern transfer. The multi-layer photolithography stack includes a bottom layer of spin-on carbon (SOC), a middle layer of Si-containing anti-reflective coating (SiARC), and a top layer photoresist. In an example, the patterns in the photoresist are first transferred to the middle layer SiARC and the bottom layer SOC. Then, the patterns in the middle layer SiARC and the bottom layer SOC are transferred down to the STI oxide, for example, via rail trench etch.

Figure 4:
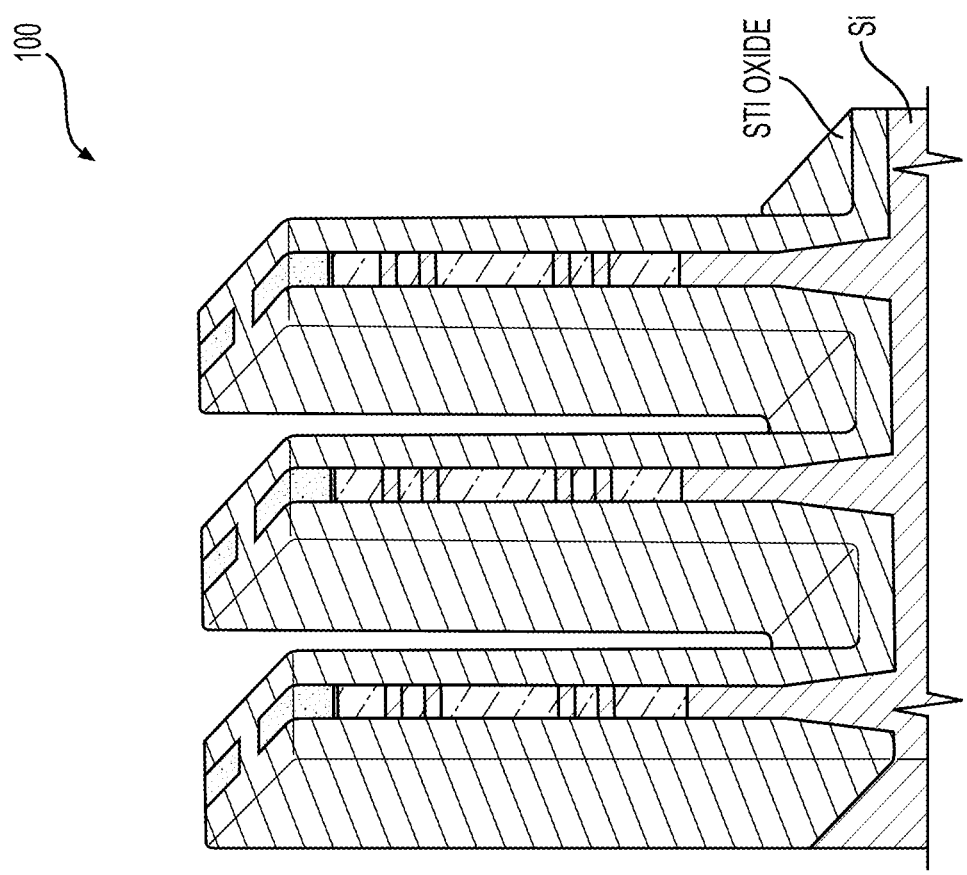

FIG. 4 shows a schematic view of the semiconductor device 100 after the buried rail trench etch. It is noted that the buried rail trench is patterned on top of the STI oxide and transferred through the STI oxide for example by etching. In an example, the pattern transfer stops well within the depth of the STI oxide. In another example, the pattern transfer etches completely through the depth of the STI oxide and extending into the bulk silicon. For the case of a wide (1.5 T to 4 T wide rail compared to a routing line) power rail, the aspect ratio of this trench is on the order 2.5 to 5.0. A deep and narrow rail can have up to 3 times the aspect ratio, or 7.5 to 15.0. This etch process will produce a very thin (<12 nm) of STI oxide that is as deep as the intended depth of the buried power rail within the STI. The challenge with transferring these narrow trenches within the oxide filling between the FINs include topple margin and distortion of the spacing between the buried power rails. The following figure shows an example result.

In a FINFET application, the bulk silicon can be heavily doped and it can be preferred to keep the rail completely within the STI. Keeping a deep rail within STI, however, causes the initial height of the FIN to be much larger than conventionally fabricated. Typically for FINFET, the fin dimensions are running around 75 A, so in this example embodiment, an aspect ratio of the FIN can be extended well over 15-1 and even approaching 20-1. Since this is extremely aggressive and prone to drive distortions in the fin shape, it can be preferable for some embodiments to drive the buried rail into the silicon. In one embodiment, a narrow buried rail can be formed through a self-alignment process, in which the initial trench is the size of a more conventional 1.5 T to 4 T power rail while it is etched through the STI.

In the embodiment of buried rail trenches being extended down to the bulk silicon, the buried rails benefit from being physically isolated from the bulk silicon by means of a conformal dielectric deposition into the trench after pattern transfer into the bulk silicon.

Figure 5:
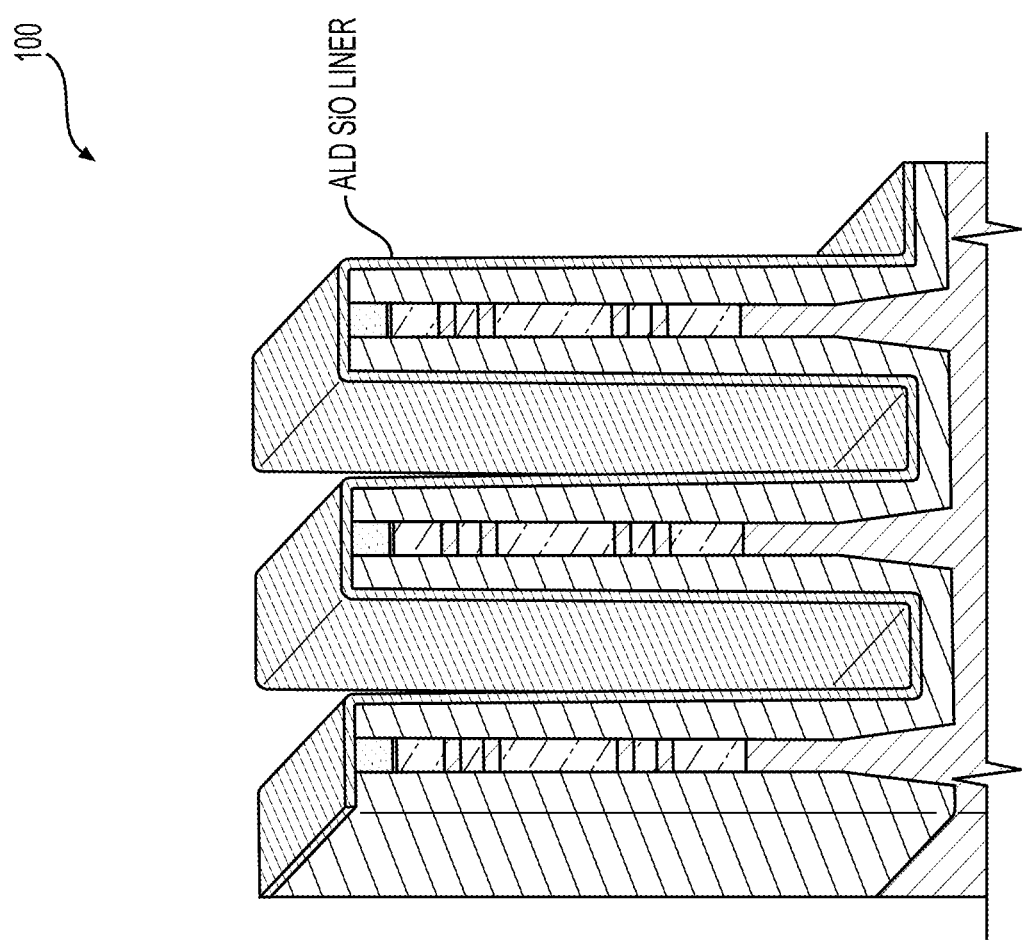

FIG. 5 shows a schematic view of the semiconductor device 100 after a liner, such as atomic layer deposition (ALD) SiO liner is deposited.

Once the intended depth of the buried power rail is reached, an etch-selective film can be conformally deposited within the trench to form a "spacer" on both sides of the trench. This etch-selective material can then go through a normal "spacer-open" etch to remove the conformal deposition at the very bottom of the trench, leaving only etch-selective materials along the side-wall of the wide trench.

In one embodiment herein, a narrow buried rail can be formed, also through a self-alignment process, in which the initial trench is the size of a more conventional 1.5 T to 4 T power rail while it is etched through the STI. Once the intended depth of the buried power rail is reached, an etch-selective film can be conformally deposited within the trench to form a "spacer" on both sides of the trench.

Figure 6:
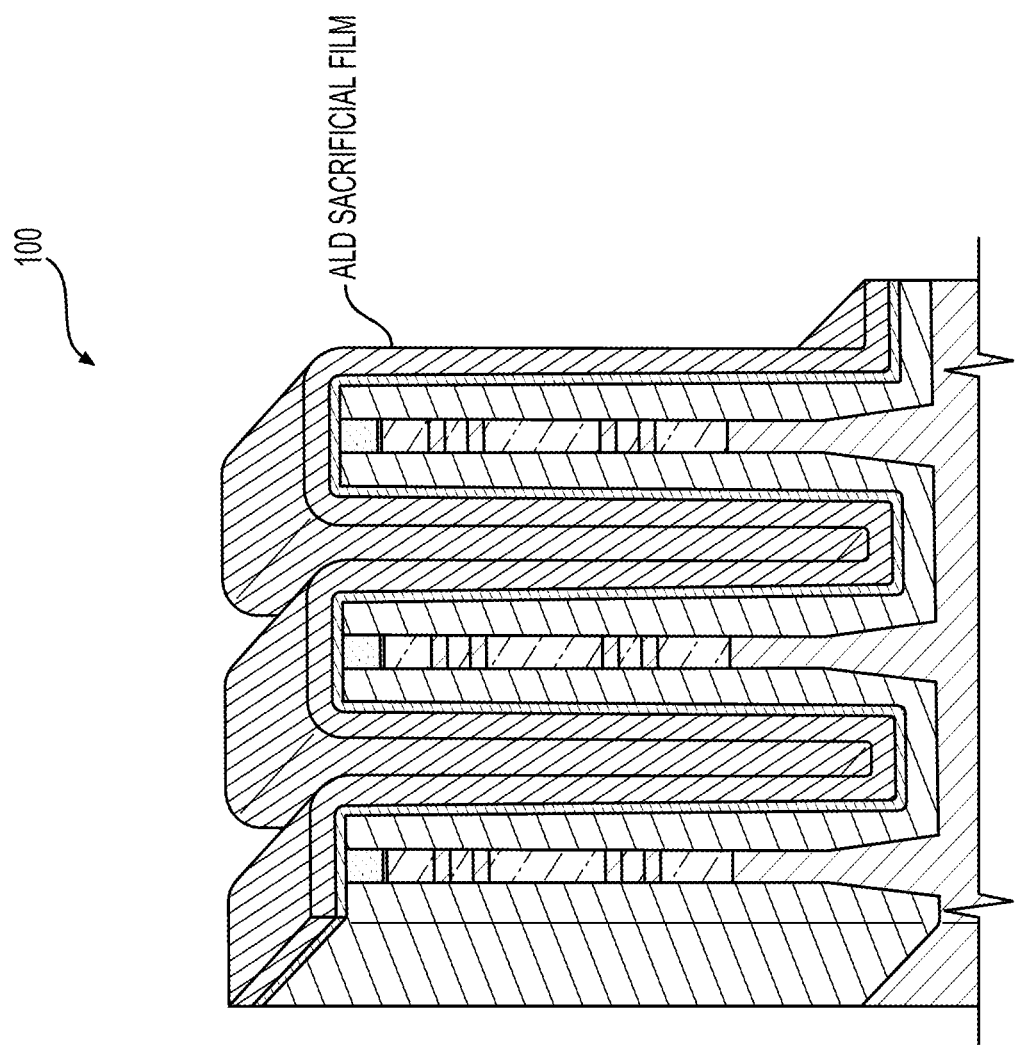

FIG. 6 shows a schematic view of the semiconductor device 100 after the etch-selective film (e.g., ALD sacrificial film) is deposited.

This etch-selective material can then go through a normal "spacer-open" etch to remove the conformal deposition at the very bottom of the trench, leaving only etch-selective materials along the side-wall of the wide trench. Oxide or other dielectric liner and/or fill material is then used to fill in the remainder of the trench and be planarized (e.g., CMP) or dry-or-wet recessed down to expose an "A/B" matrix where A is STI oxide or fill oxide and B is the etch selective material within the trench.

Figure 7:
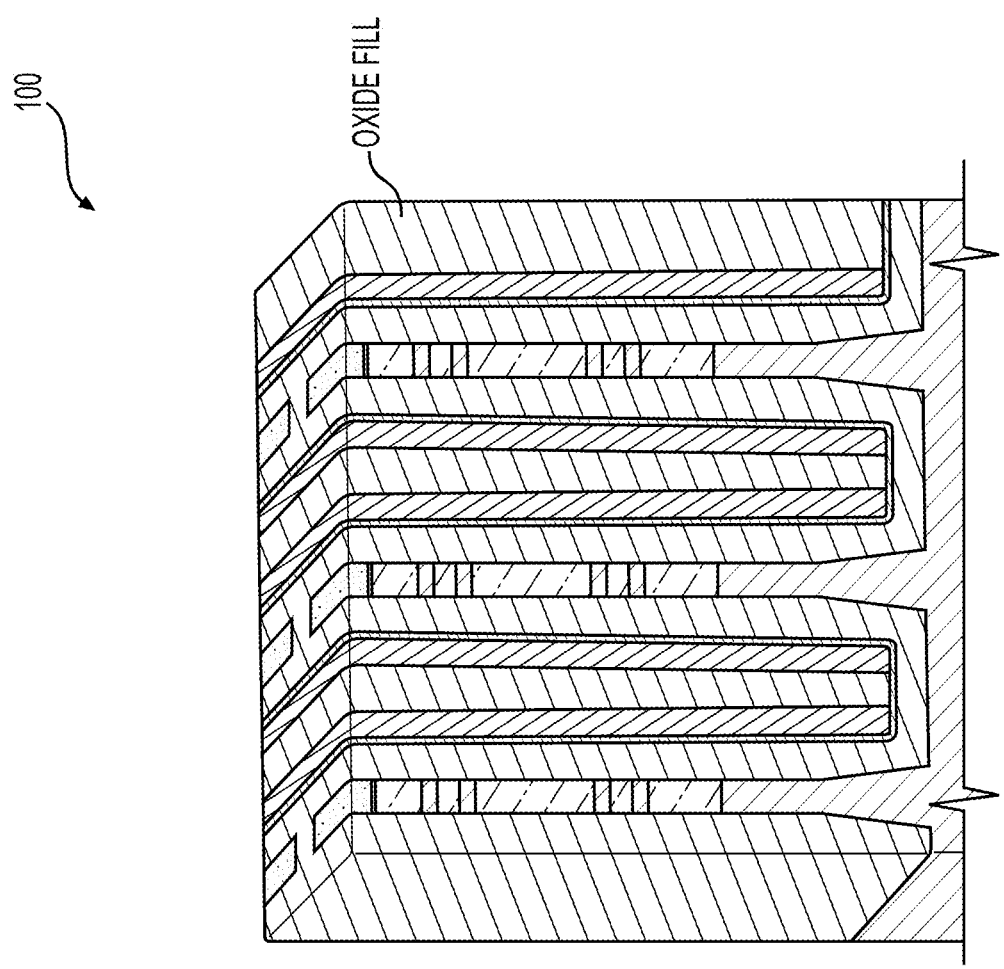

FIG. 7 shows a schematic view of the semiconductor device 100 after the oxide fill.

Further, a non-aggressive etch process can then be used to exhume the etch-selective material "B" which will result in two identical trenches being formed.

Figure 8:
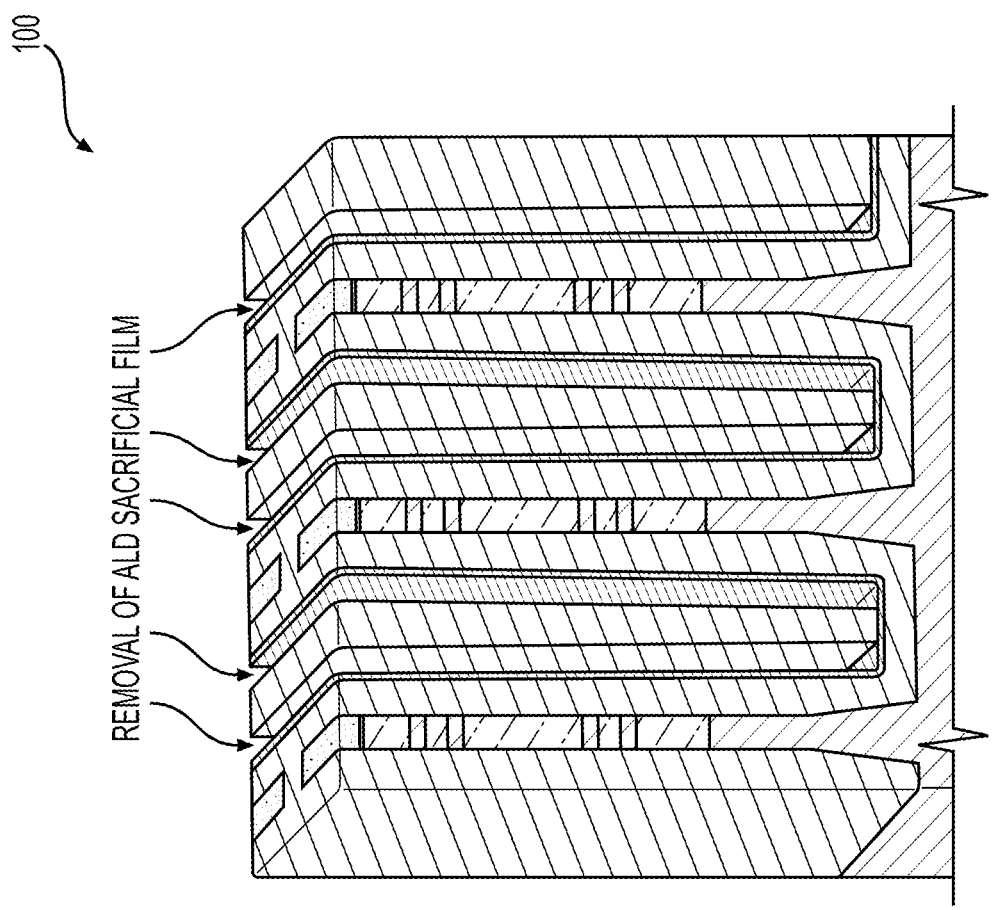

FIG. 8 shows a schematic view of the semiconductor device 100 after the two identical trenches are formed.

In an embodiment, the two trenches can be identical since they were both originally formed through a single conformal deposition process. There are multiple low-aggressive etch processes which will prevent the oxide between the two adjacent narrow trenches to collapse. One such process is chemical oxide removal (COR) vapor-phase etch in which selectivities up to a hundred to one can be achieved, as well as other quasi Atomic Layer Etching (ALE) and wet and or dry etches. The following figure shows an example result.

Next, in an example, the bottom of the trench is filled with metal and/or liner to be used for the buried power rail. The choice of metallization for buried power rails is based on where in the integration flow the rail is formed and metalized. For the case of forming and metalizing the buried rails well before spike-anneal on S/D epi is done, the metal needs to have very good thermal characteristics on oxide—specifically able to be stable under spike anneal temperatures, which can range between 700 and 1100 C, as well as deposition temperatures of films to be used in the metal gate. For the embodiment in which the buried rail is placed before metal gate deposition and S/D spike anneals, this would preclude the use of metals such as copper (<450 C thermal stability), cobalt, or aluminum. However, ruthenium is selectable for metalizing a buried power rail at this point in the integration given that it has excellent thermal stability over oxide, and can also be deposited into the deep trench using a bottom-up deposition process. However if a metal such as ruthenium were to be used; this would drive the buried power rail to be a narrow rail rather than a 1.5 T to 4 T size rail, due to resistivity of the ruthenium and its subsequent resistance. Since it would be more difficult to make connection to a narrow power-rail bottom-up, in some embodiments, the connection to the metal drain can be self-aligned. The following figure shows an example result.

Figure 9:
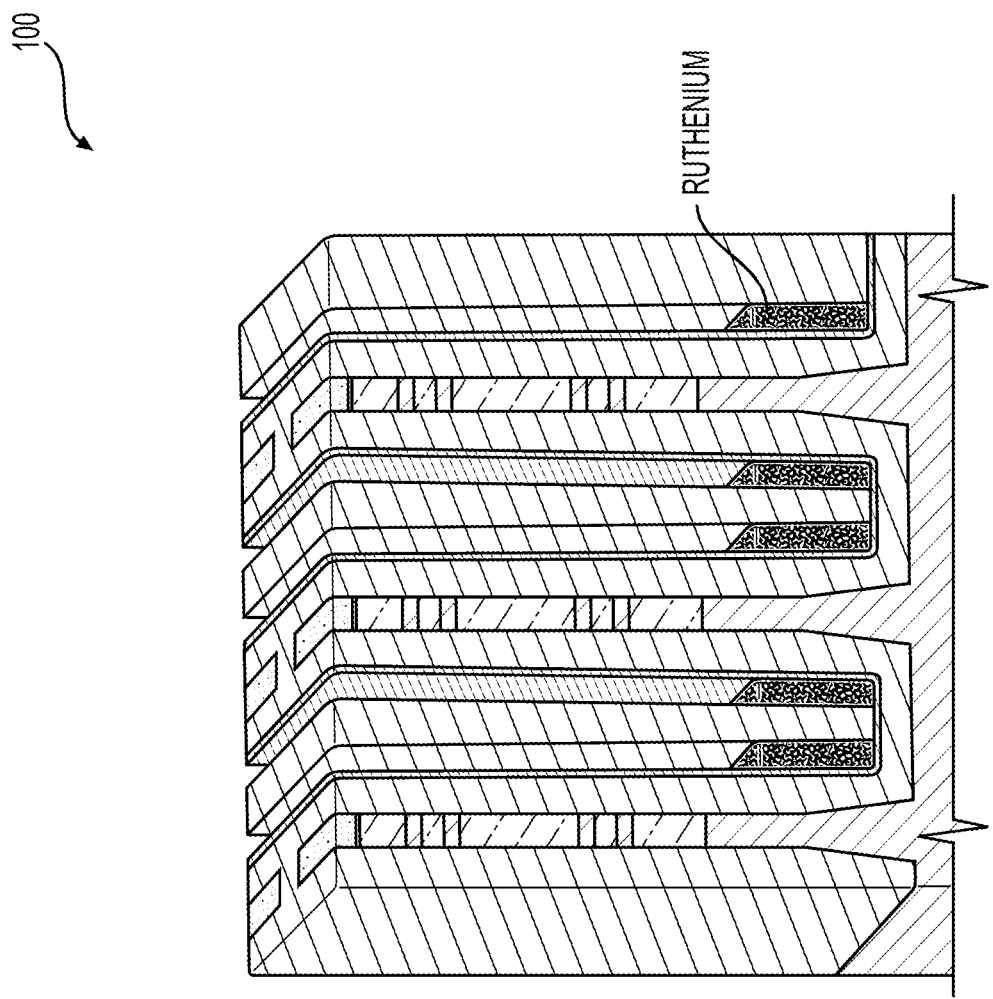

FIG. 9 shows a schematic view of the semiconductor device 100 after filing the bottom of the trench with ruthenium. In an example, the ruthenium is filled over the trench and the surface, and etched back (recessed) to the bottom of the trench.

Techniques herein include bottom-up self-alignment of the power rail to the metal drain by using an etch-selective cap over the recessed ruthenium (or any other metal). It is noted that metallization can be executed after S/D spike anneal or during the actual metal drain metallization when the power rail is created through a replacement method. For the case of ruthenium, the cap can be (a) dielectric and have adequate size to be a true dielectric between the power rail and metal drain located above the rail, or (b) etch-selective to the bordering STI oxide or dielectric liner.

Figure 10:
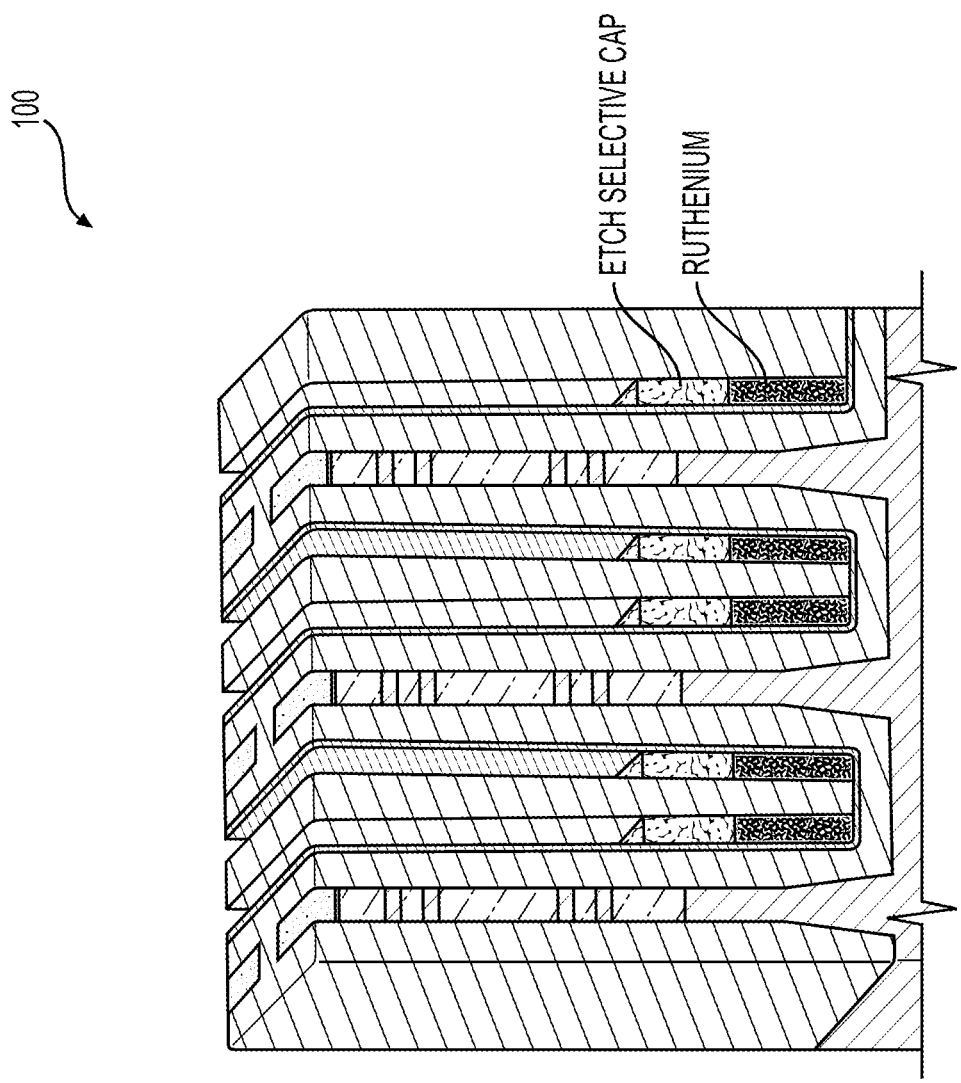

FIG. 10 shows a schematic view of the semiconductor device 100 after etch selective cap is formed over the recessed ruthenium.

The remainder of the buried rail trench is then filled with STI oxide or other dielectric and then polished down to the top of the FIN structures.

Figure 11:
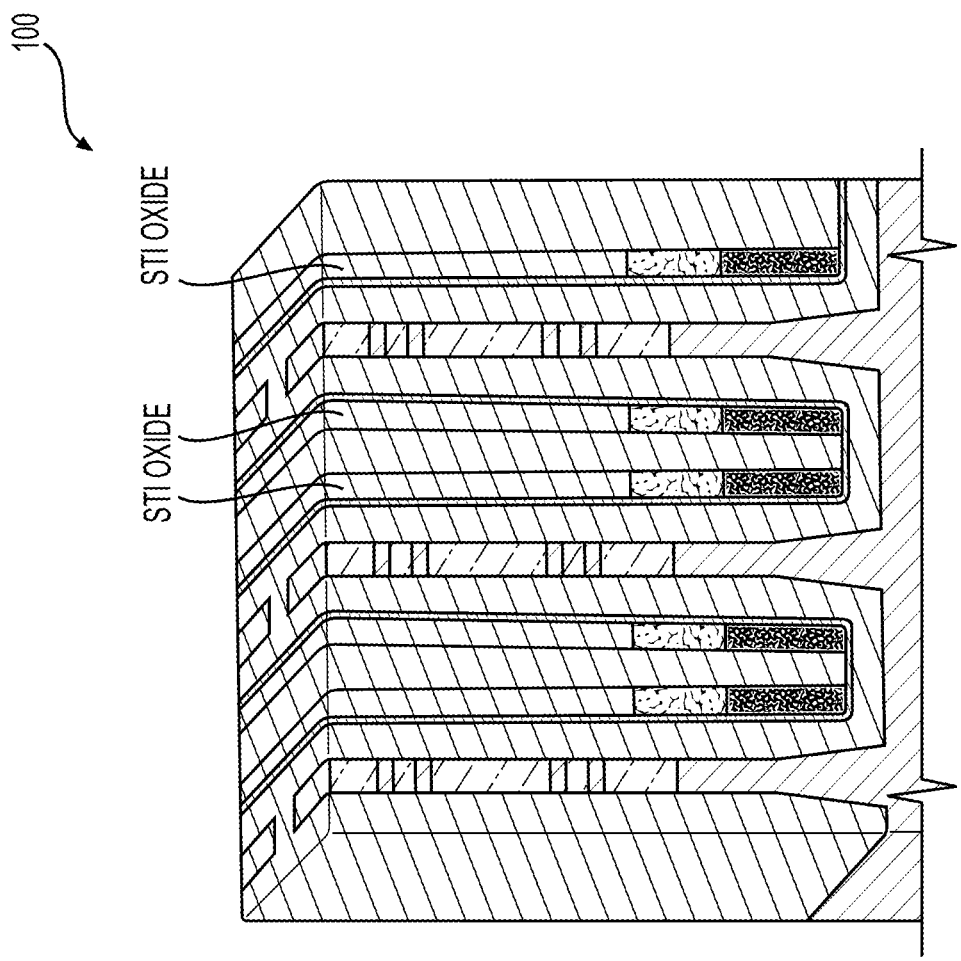

FIG. 11 shows a schematic view of the semiconductor device 100 after STI oxide is filled and polished down.

Next, a STI recess etch process can be executed to bring the STI down to the bottom of the active FIN or to the SiGe for this example for complementary stacked nano-sheets. The STI etch can stop at the top of the etch-selective dielectric cap over the buried power rail.

Figure 12:
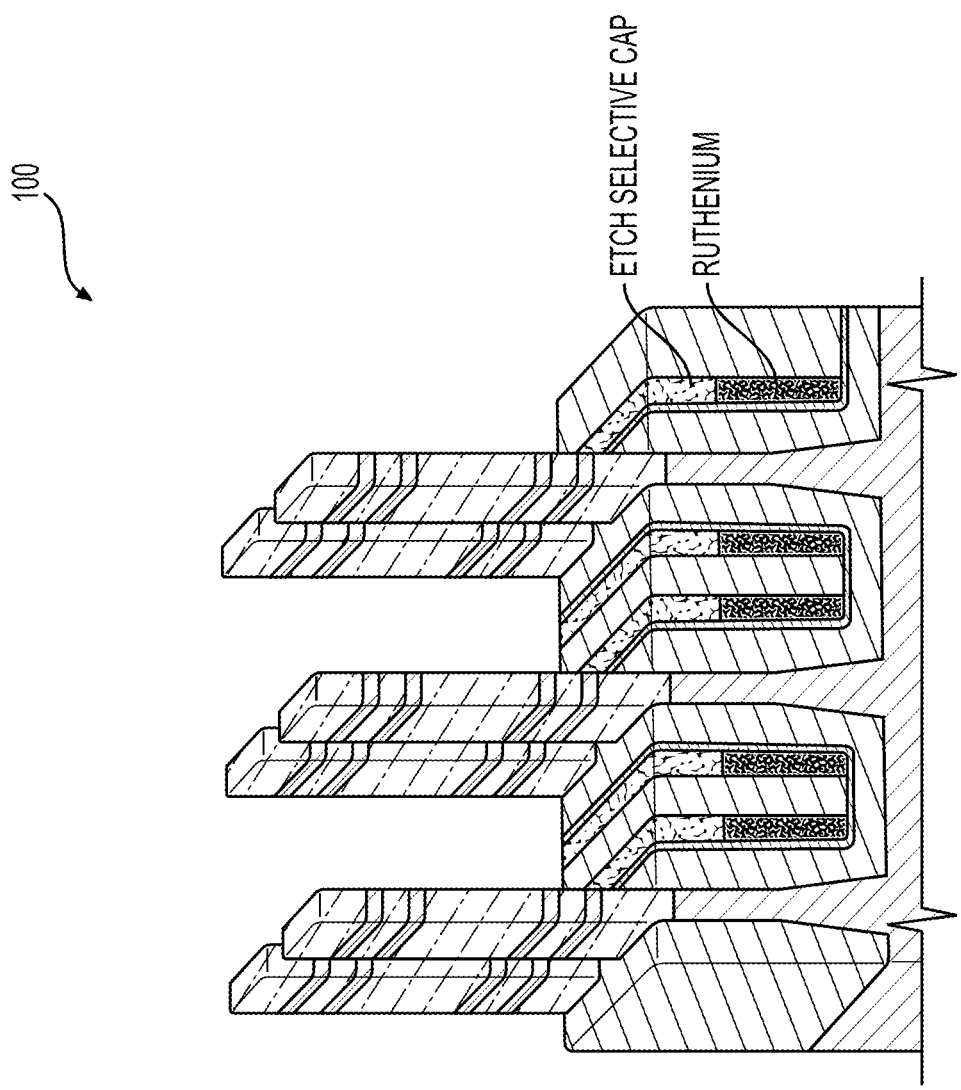

FIG. 12 shows a schematic view of the semiconductor device 100 after STI recess etch process.

It is note that other optional embodiments can be used to metalize the buried power rail to drive the metal selection beyond ruthenium or other selectively depositable metals. Another option that enables other metals to be incorporated into the buried power rail is to do a full replacement metal rail in which during the buried rail trench definition process, instead of filling the rail with metal and capping with an etch-selective dielectric, the trench is completely filled with the dielectric and then recessed down to the intended height of the metalized buried rail. During subsequent connection to the metal drain, the entire replacement rail can be isotropically removed and then re-filled in with metal. It is beneficial for the buried power rail to run undisturbed across a given cell and to adjacent given cells. Having such a continuous power rail metal can be challenging. In such an embodiment, the entire replacement rail is removed both from active contact points to the metal drain, as well as to points where no connection is desired. When the metal is filled, such a fill in this case is executed as a "subway" fill (instead of a simple top-down or bottom-up fill) in which the metal extends along the length of the buried rail running under metal drains with no desired connection to the rail.

Continuing with the integration embodiment herein in which the rail has just been metalized and capped with an etch-selective dielectric cap, process flow continues to after the S/D has been formed and through spike anneal and following through replacement metal gate metallization. At this point in the integration flow, contact is made between the intended metal drain and the select points of contacts to the power rails.

The exemplary embodiment uses complementary FET stacked nano-sheets as an example, description focuses primarily on tap made from metal drain to Vss which connects to the bottom-most of two stacked electrodes (the bottom being NMOS and top being PMOS).

At this point, the metal drain has not been metalized and is filled with oxide during the metallization of the metal gate. At this point, the oxide within the metal drain is recessed down to the top of the etch-selective dielectric cap over the buried power rail (or the oxide can be removed fully if there is an etch-stop between the STI and the metal drain fill oxides). The incorporation of the etch-selectivity nature of the cap ensures that when the metal drain is opened, that a self-aligned etch process can be employed in which the cap can be opened without further opening the STI oxide along the axis of the buried rail. This also enables the full metal drain to open the cap to the buried power rail and always control the tap to be the same identical size of the initial buried rail trench, which is also identical to the size of the buried power rail itself minus further deposited liners within the trench. This allows for complete freedom of the size of the metal drain to be used, which is beneficial for area-scaled devices where pin access is severely limited.

Figure 13:
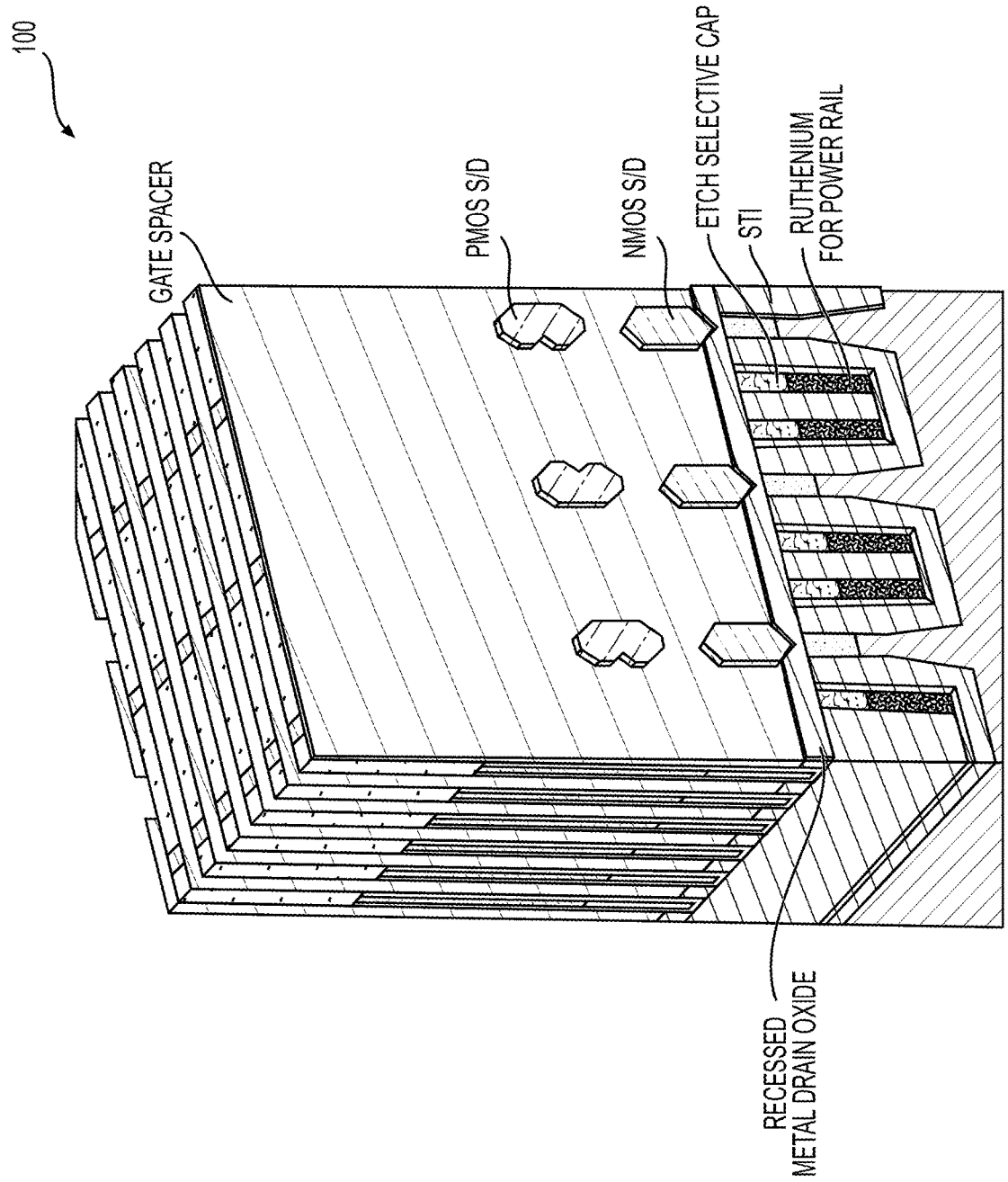

FIG. 13 shows a schematic view of the semiconductor device 100 after the oxide within the metal drain is recessed down to the top of the etch-selective dielectric cap.

The metal drain can be filled with either oxide (if there is a stop-layer between the oxide and the STI) or with some other material done in what is commonly referred to as a replacement contact. The replacement contact generally has very good selectivity to multiple films: (a) the oxide in the STI, (b) the dielectric cap protecting the buried rail, (c) the cap protecting the metal gate, which is typically some type of nitride, and (d) the low-k gate spacer. The following figure shows an example result.

Figure 14:
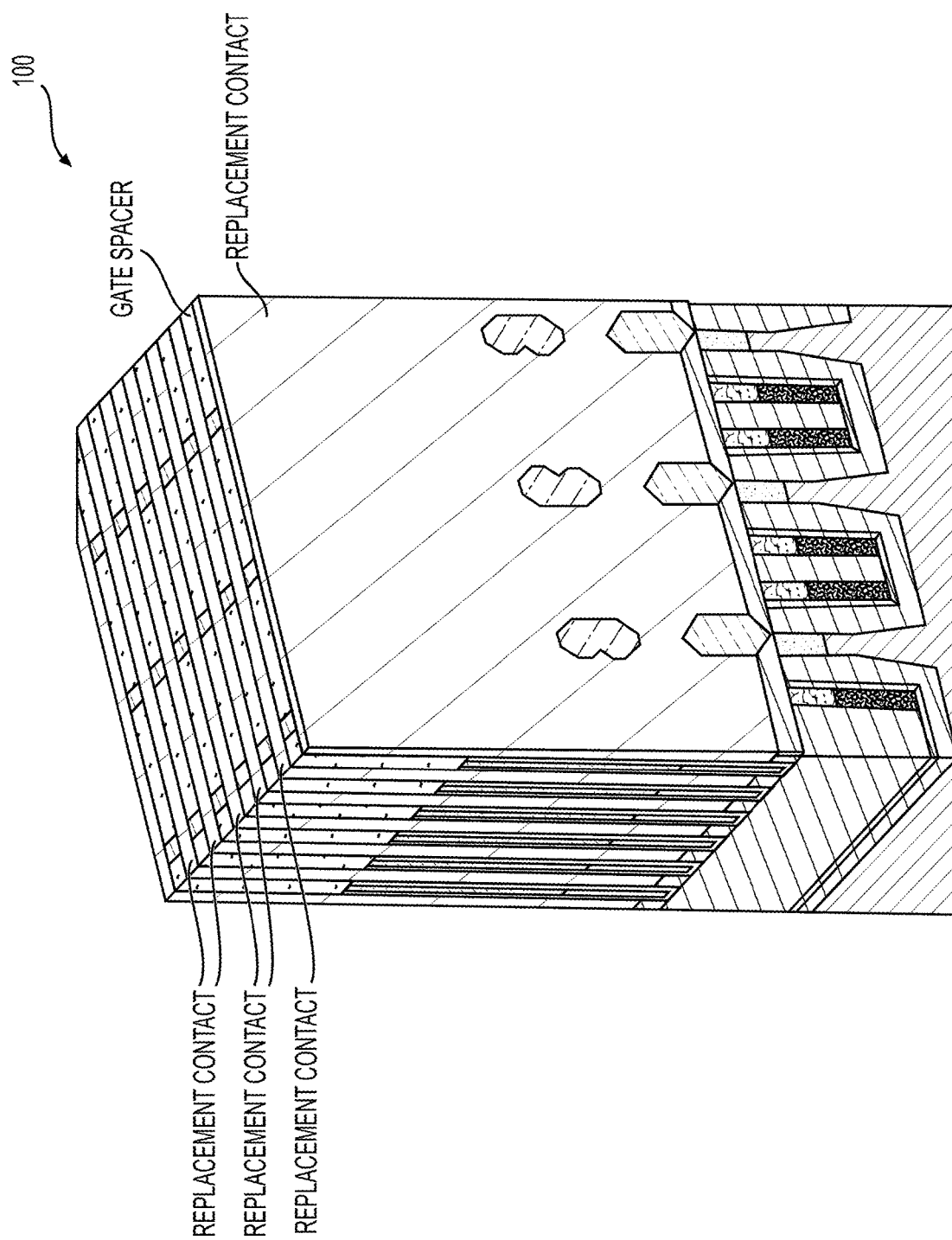

FIG. 14 shows a schematic view of the semiconductor device 100 after the fill with the replacement contact.

The power taps to the power rails are imaged (patterned) and transferred down through the replacement contact. Since the buried power rails will drive the BEOL metal lines to be a series of dense routing lines, the spacing between cells in the north-south orientation will simply be ½ critical metal pitch, or for the consideration of Foundry N5 technology, roughly 12 nm. For power taps made by two adjacent cells to a same location along the power rail latitudinal axis, this means that it would be difficult to image discrete vias, even with EUV multiple patterning. So self-alignment is beneficial in order to ensure that such a situation does not cause shorting between adjacent cells. This is where the self-alignment comes in from the fact that the initial wide trench is self-aligned patterned to form two identical narrow rails. Thus, each "pair" of rails would correspond to either Vdd or Vss, since cells in north-south orientation share either Vss or Vdd rails, this method of self-alignment not only provides for resistance improvement, but for ensuring that two adjacent cells are not shorted.

Figure 15:
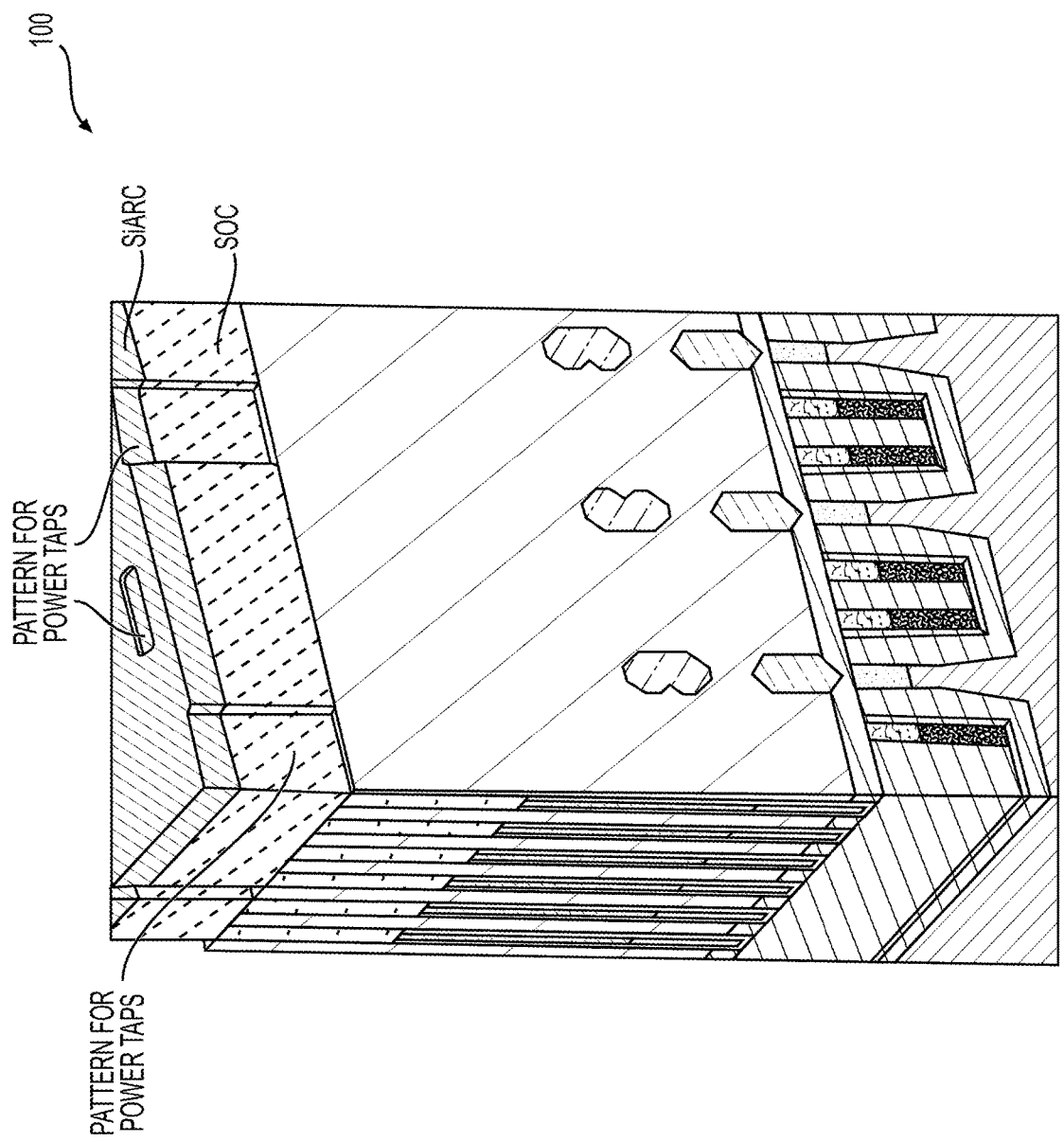

FIG. 15 shows a schematic view of the semiconductor device 100 after the power taps are imaged in SiARC and SOC layers for example from a photoresist layer.

The etch selective cap over the power rail can be removed for metal drain contacts where such tapping to the power rail is required.

Figure 16:
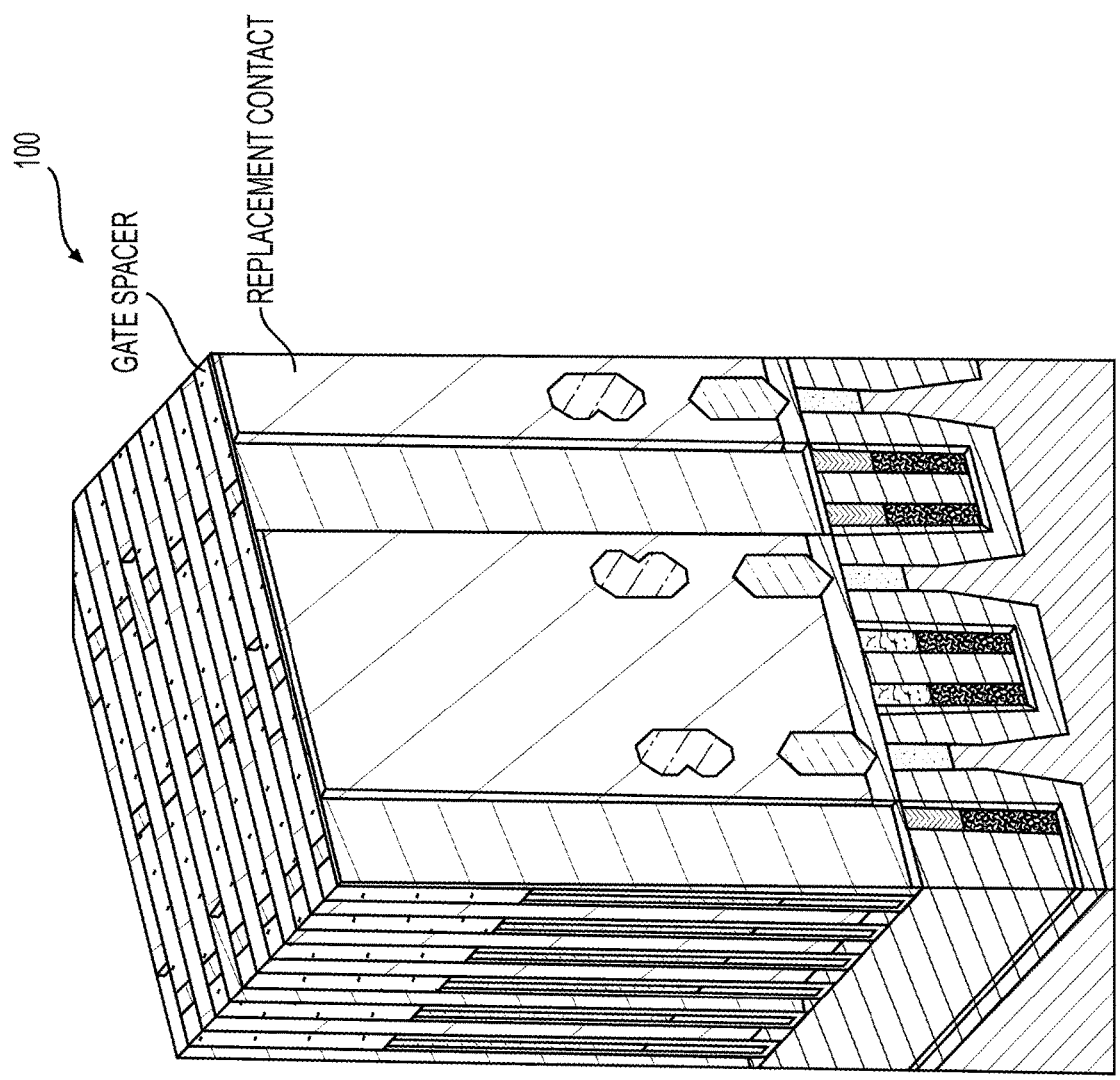

FIG. 16 shows a schematic view of the semiconductor device 100 after the removal of the etch selective cap.

The replacement contact material in the metal drain can then be removed.

Figure 17:
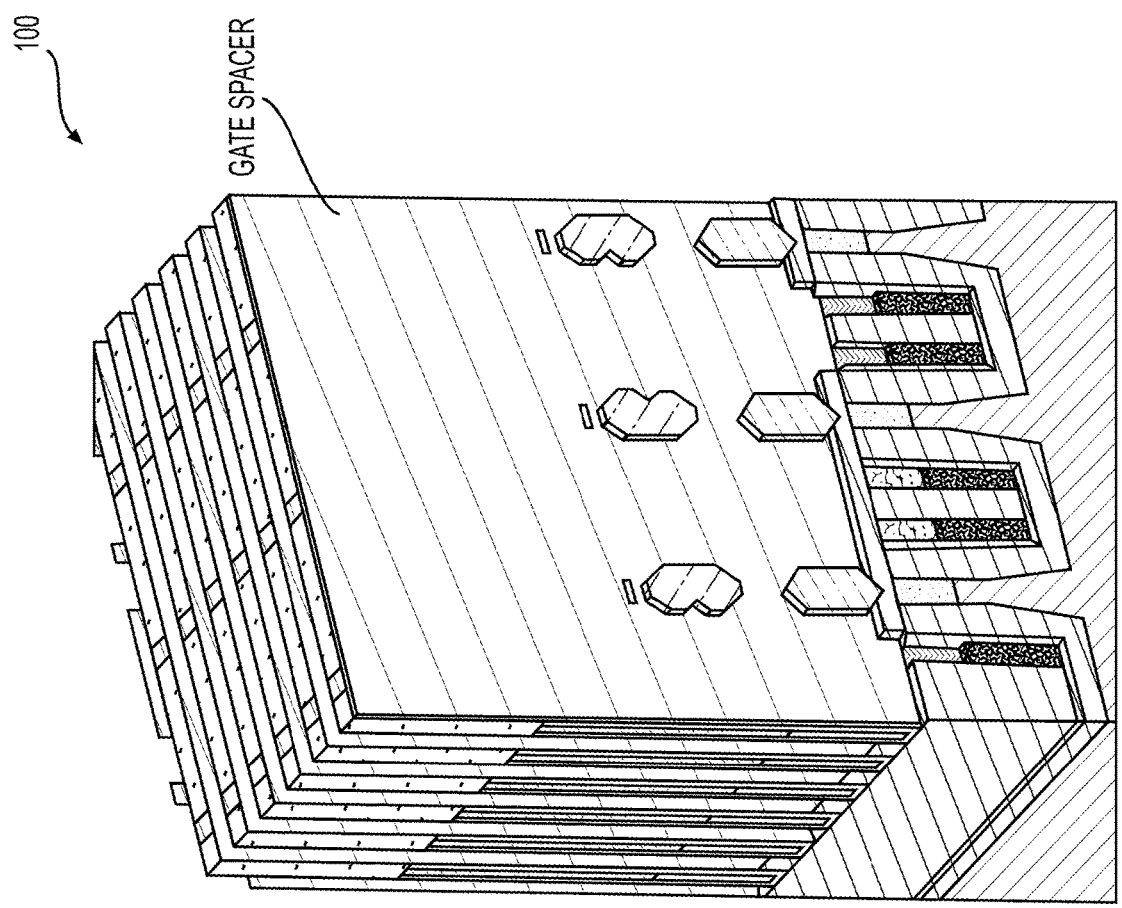

FIG. 17 shows a schematic view of the semiconductor device 100 after the replacement contact is removed.

The metal drain can then be metalized where the connection to the desired rails is equally filled, while the unwanted connections are still be blocked by the etch-selective caps which were not opened during the transfer of the taps through the metal drain.

Figure 18:
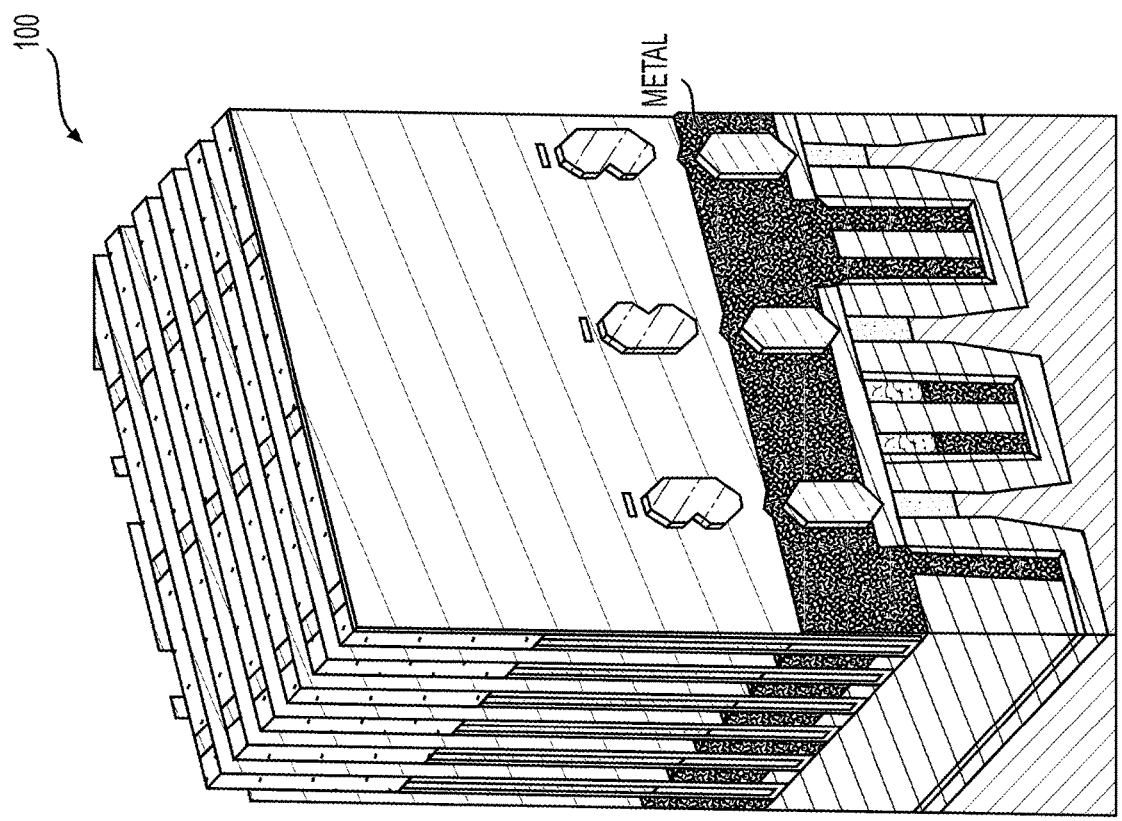

FIG. 18 shows a schematic view of the semiconductor device 100 after the drain metallization for the bottom electrode.

For the case of complementary stacked nano-sheet FET, a bottom electrode (NMOS) needs to be metallized separately from an upper electrode (PMOS). Likewise, the power taps to the Vss and Vdd rails occur for both sets of electrodes. In embodiments herein, the separate metallization can be executed using multiple metallization and etch steps, or through selective deposition.

Figure 19:
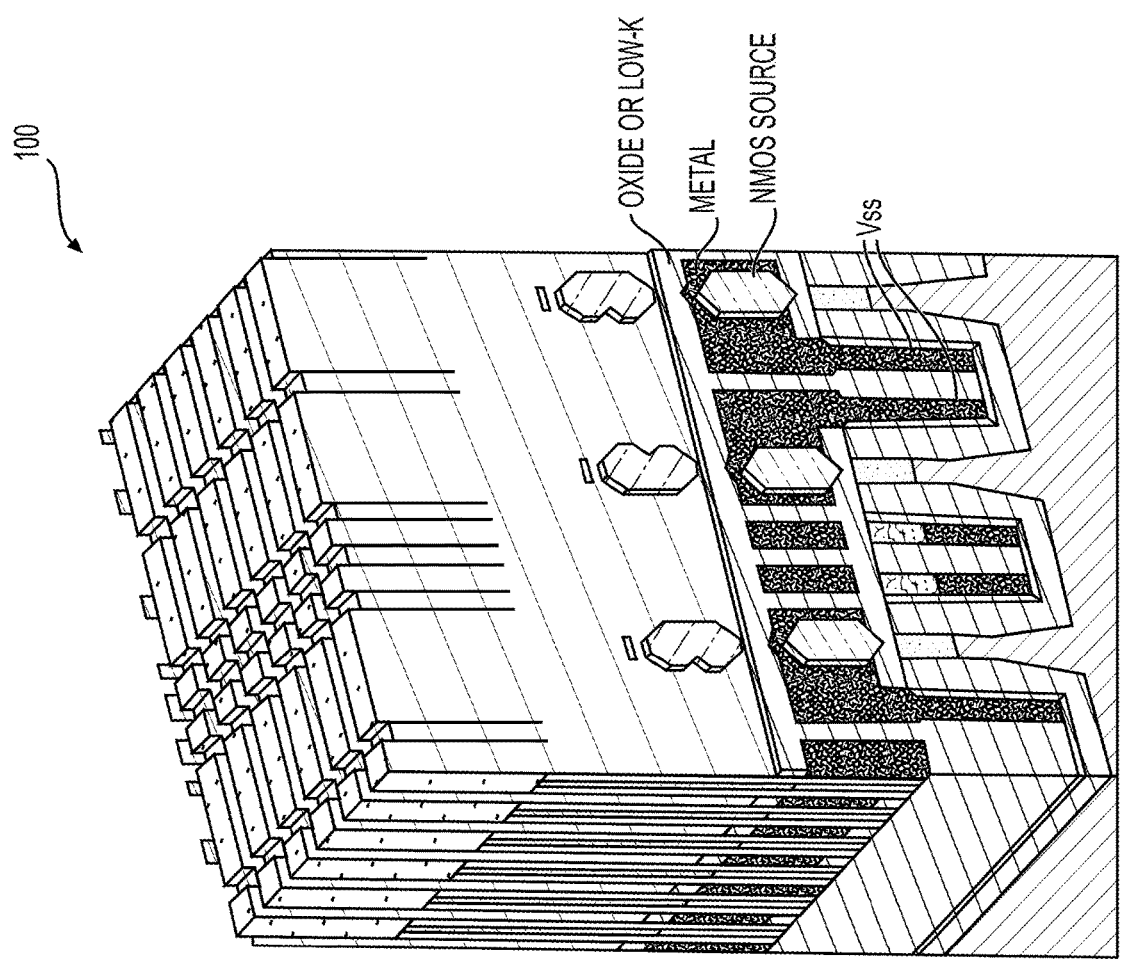

FIG. 19 shows a schematic view of the semiconductor device 100 after patterning the metallization for the bottom electrode and deposition of oxide layer.

Figure 20:
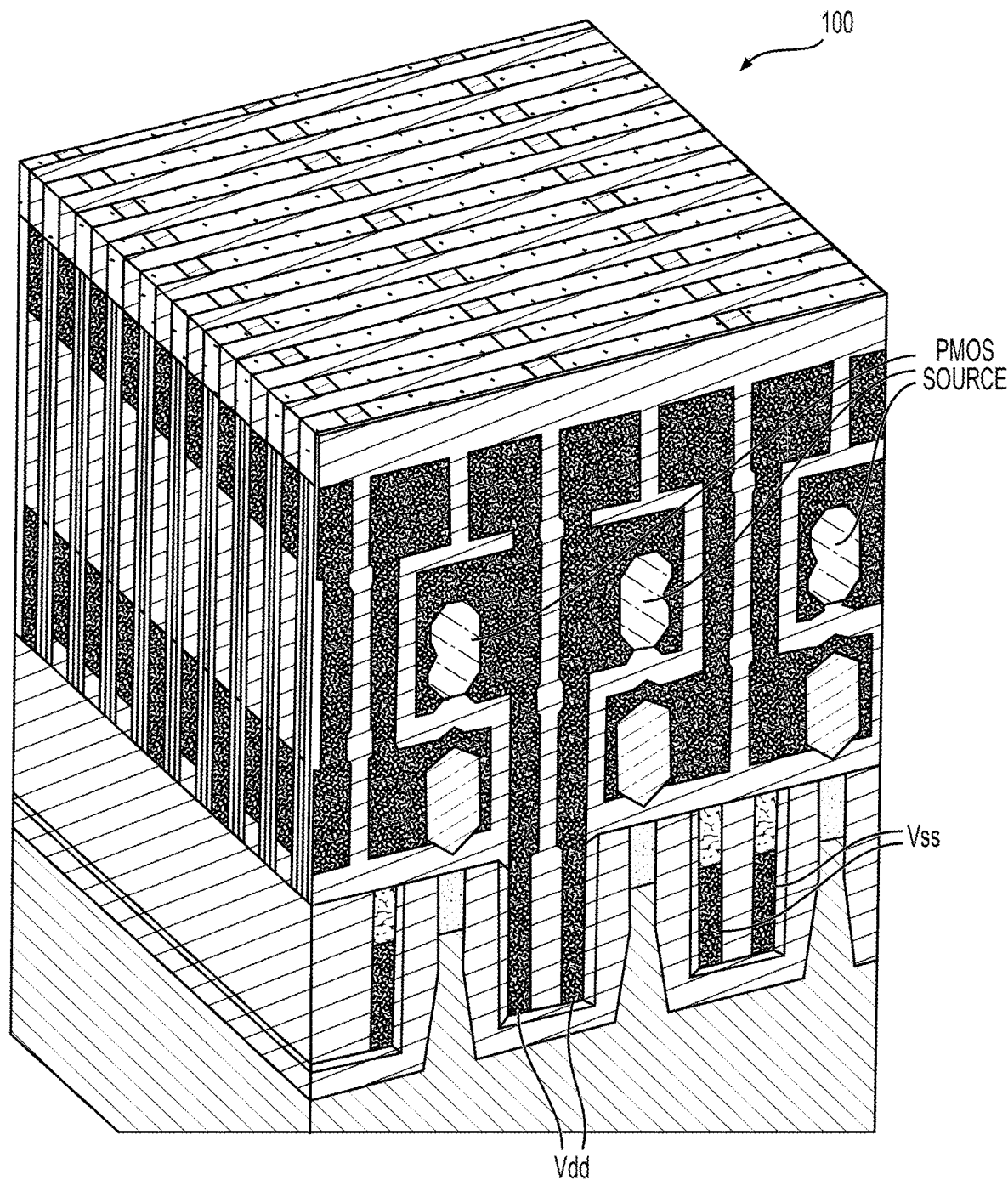

FIG. 20 shows a schematic view of the semiconductor device 100 after the drain metallization for the top electrode and deposition of oxide layer.

It is noted that, in the semiconductor device 100, each power rail includes two rail lines that are formed using open-spacer technique. The process can be modified to form wide power rail, such as shown by FIGS. 21-30.

Figure 21:
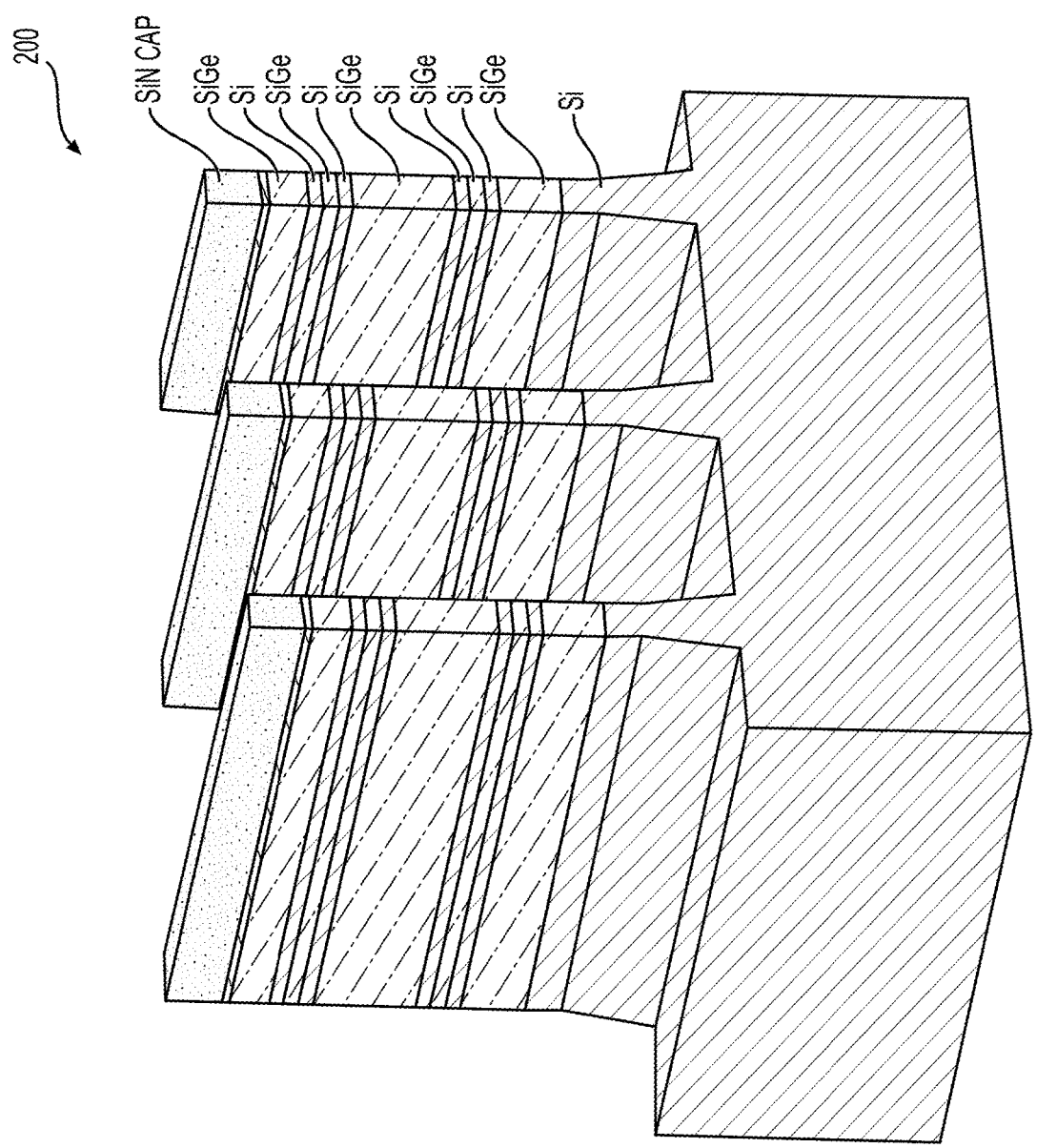
FIGS. 21-30 show various schematic views of intermediate stages for forming buried power rail according to some embodiments of the disclosure.

FIG. 21 a shows a schematic view of a portion of a semiconductor device 200 during a semiconductor manufacturing process according to some embodiments. FIG. 21 is similar to FIG. 1. In the FIG. 21 example, the Si/SiGe FIN etch has been completed and a Pad oxide/SiN cap is left on the top of the FIN.

Figure 22:
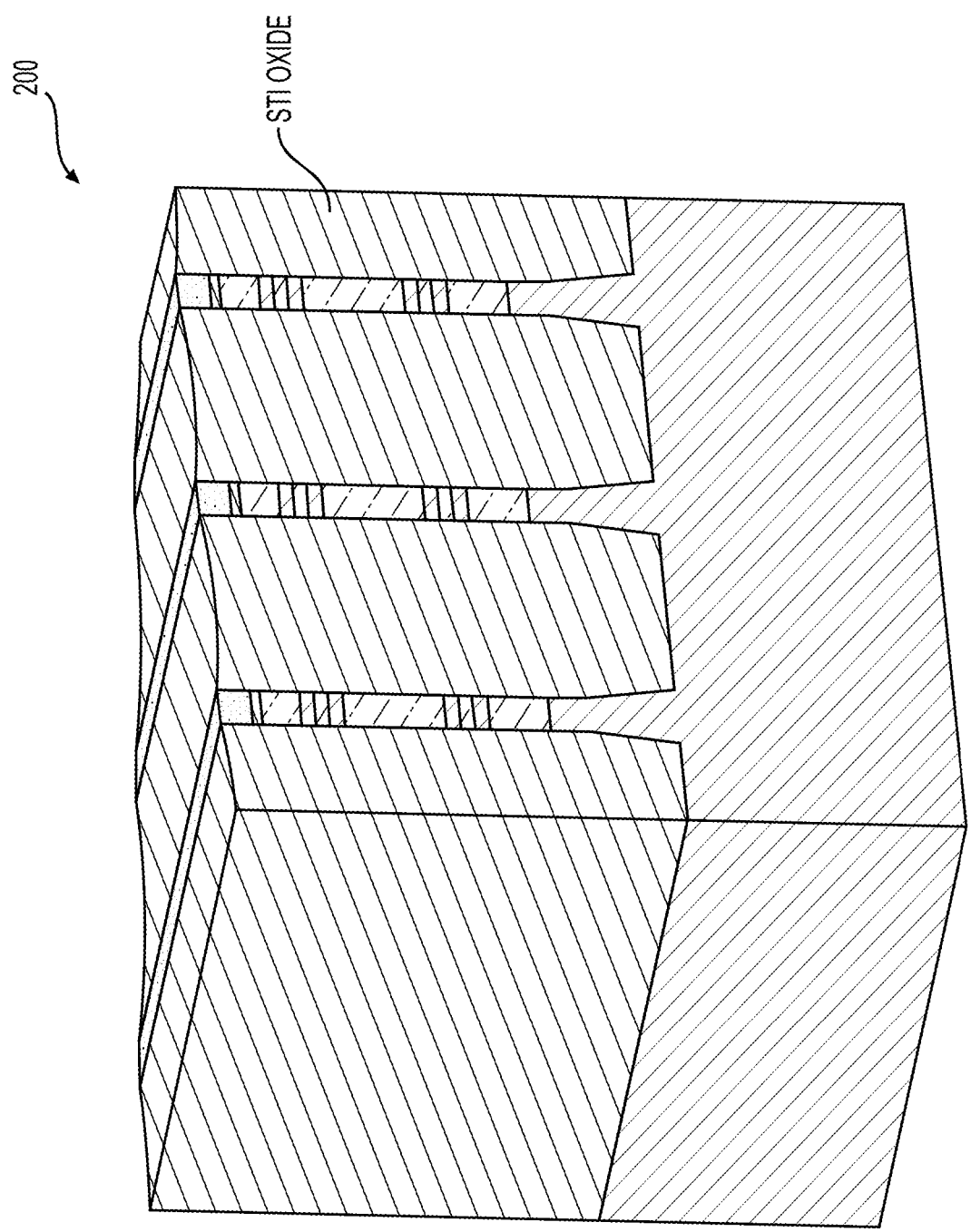

FIG. 22 shows a schematic view of the semiconductor device 200 after shallow trench isolation (STI) is done through deposition of oxide and CMP-back to the top of the Si/SiGe FIN structure. FIG. 22 is similar to FIG. 2.

Figure 23:
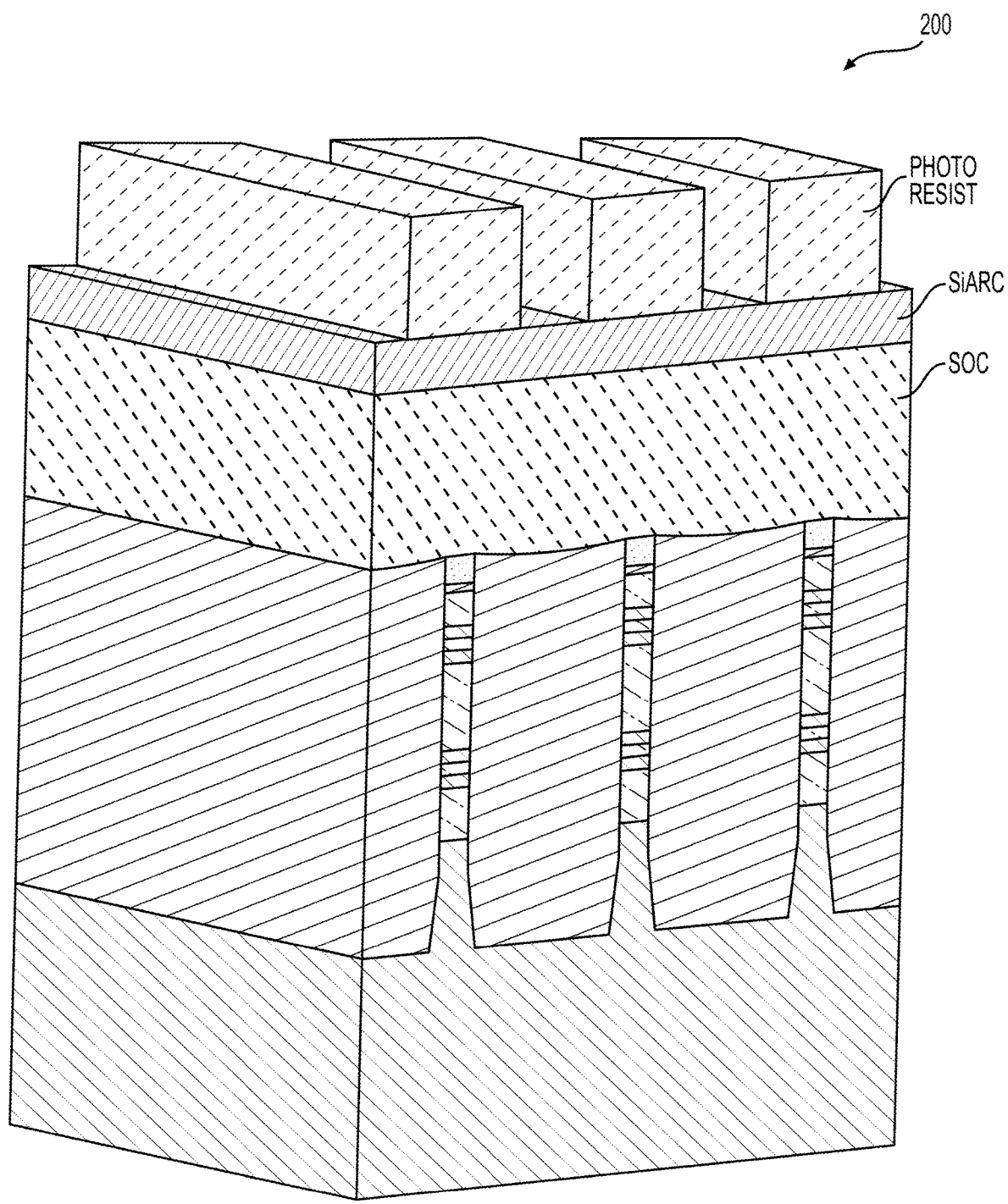

FIG. 23 shows a schematic view of the semiconductor device 200 after generating patterns for rail trench in a photoresist layer. FIG. 23 is similar to FIG. 3.

Figure 24:
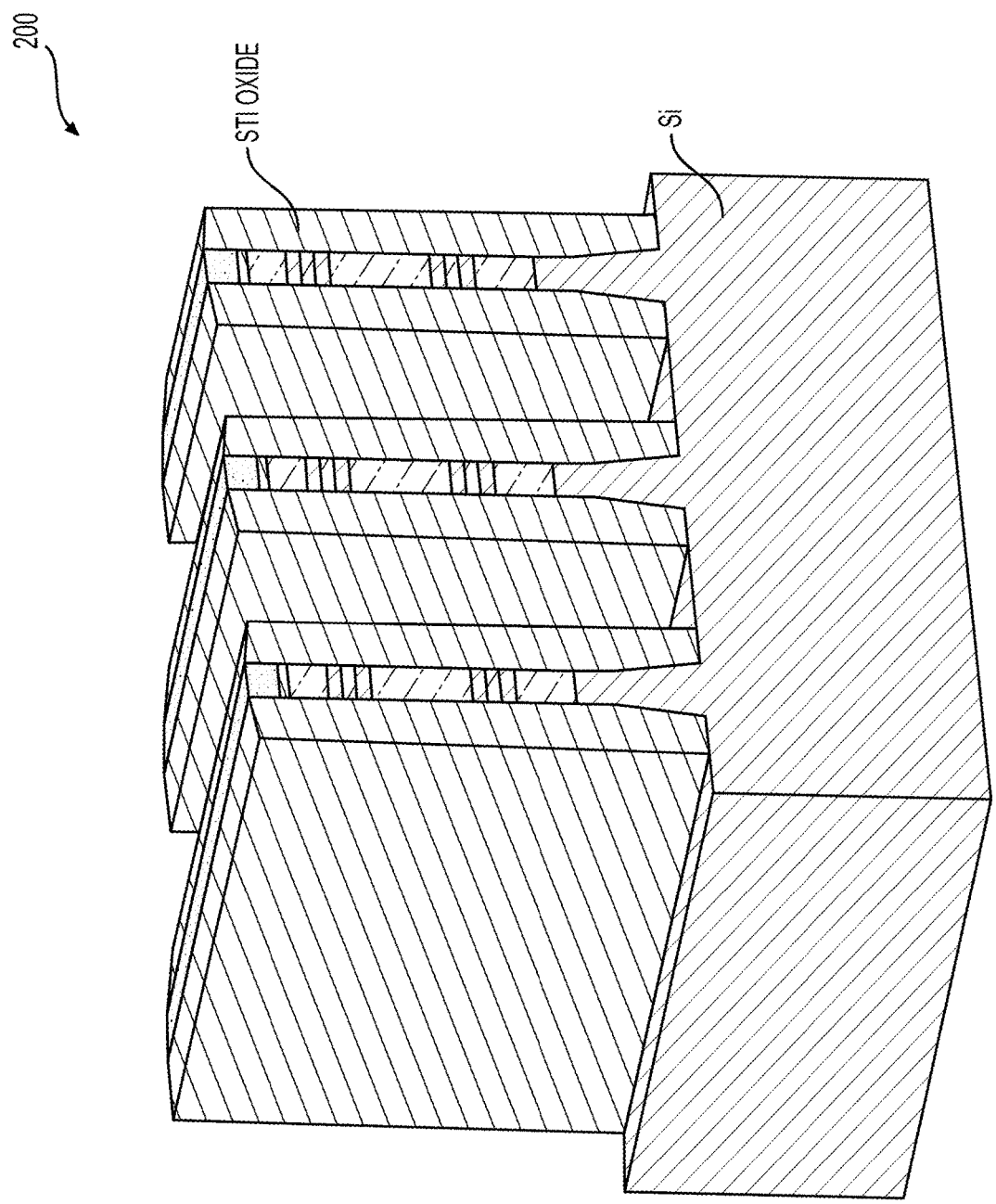

FIG. 24 shows a schematic view of the semiconductor device 200 when the patterns are transferred through the STI oxide for example by etching.

Figure 25:
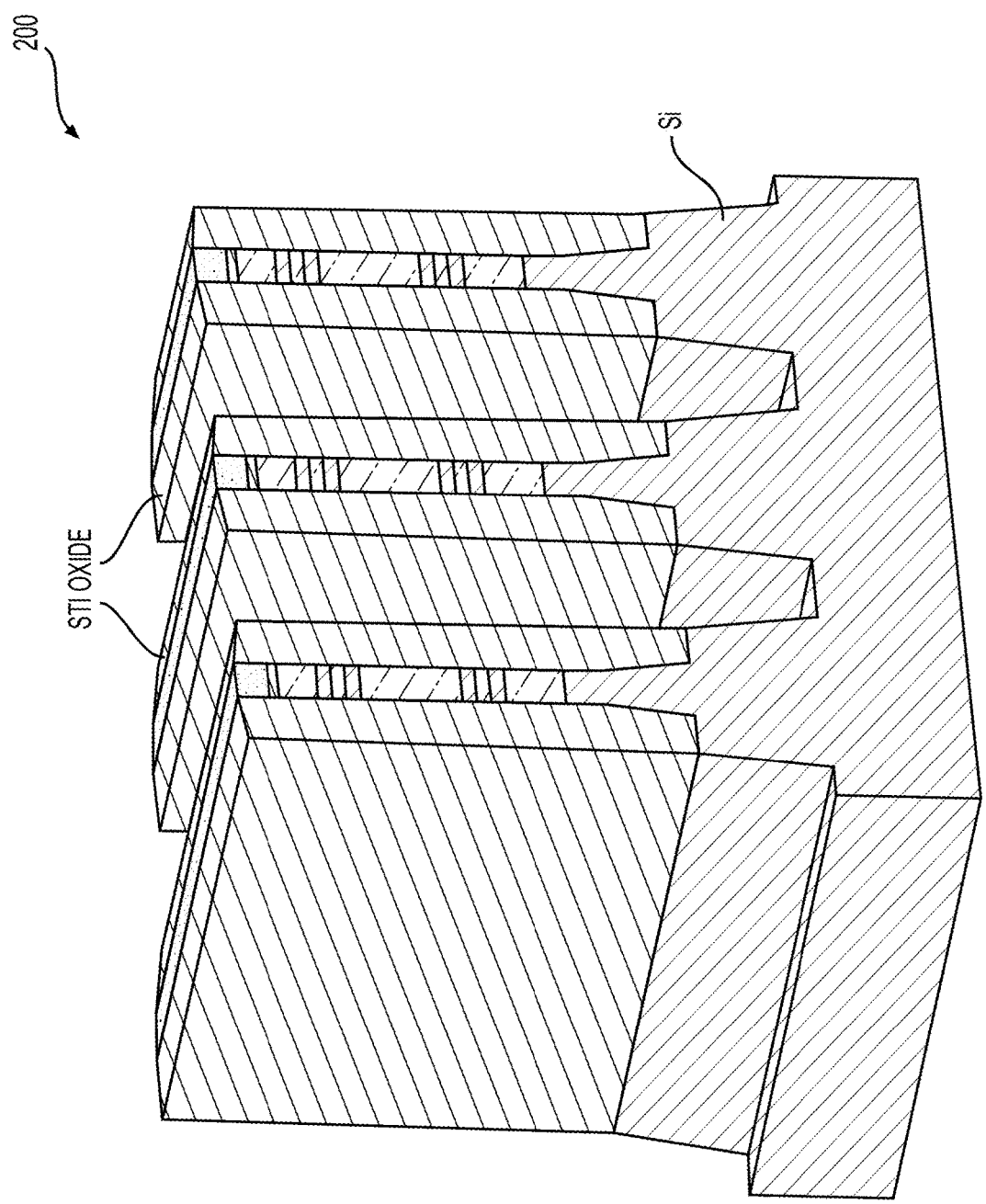

FIG. 25 shows a schematic view of the semiconductor device 200 when the patterns are further transferred into the bulk silicon. In an example, a spacer layer is deposited before the pattern transfer into the silicon to assist the pattern transfer into the silicon.

Figure 26:
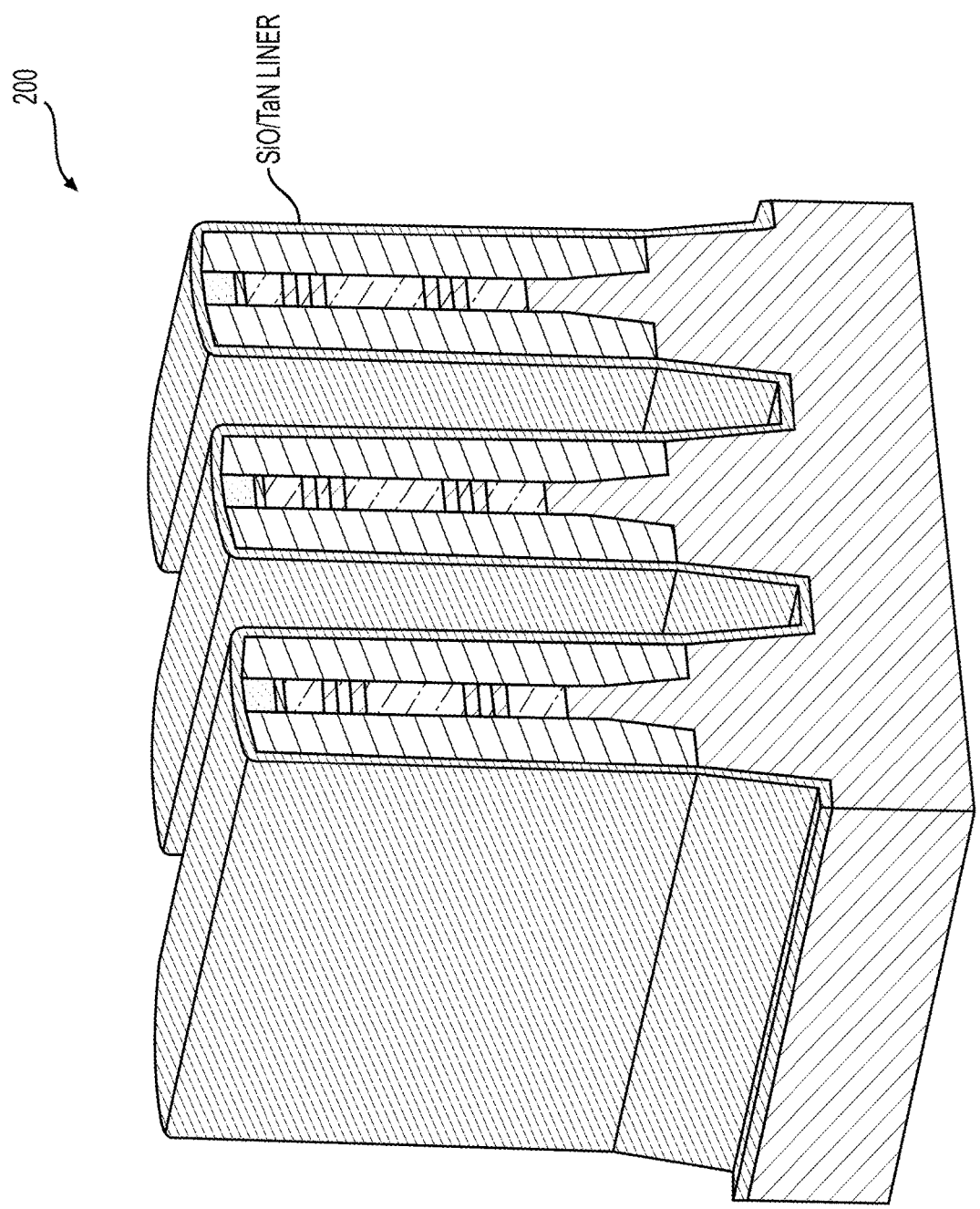

FIG. 26 shows a schematic view of the semiconductor device 200 after an etch-selective film, such as SiO/TaN liner, is deposited.

Figure 27:
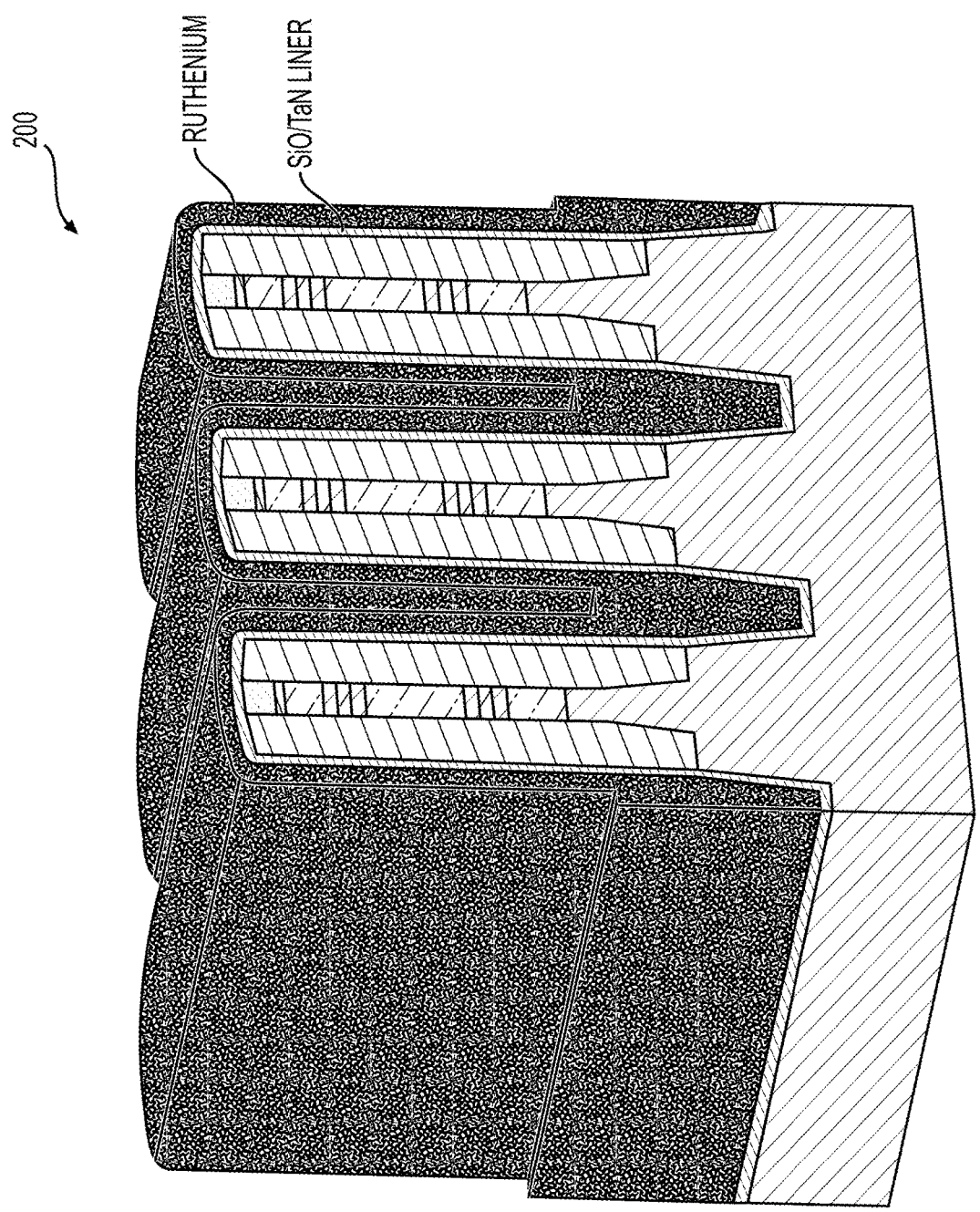

FIG. 27 shows a schematic view of the semiconductor device 200 after the ruthenium bottom fill.

Figure 28:
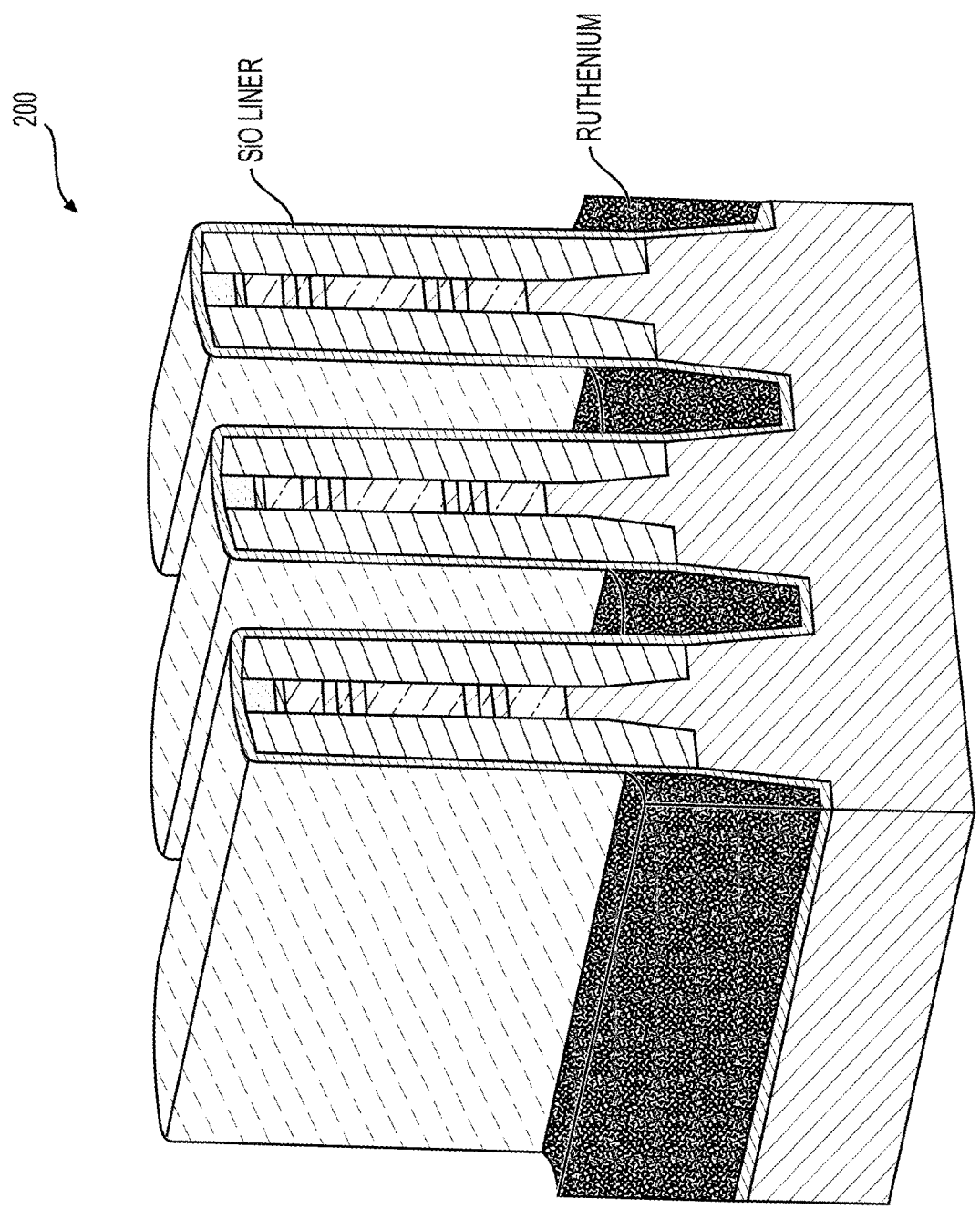

FIG. 28 shows a schematic view of the semiconductor device 200 after etching back the ruthenium. The ruthenium is etch-recessed in the rail trench of a specific depth. Further, the TaN in the liner is removed.

Figure 29:
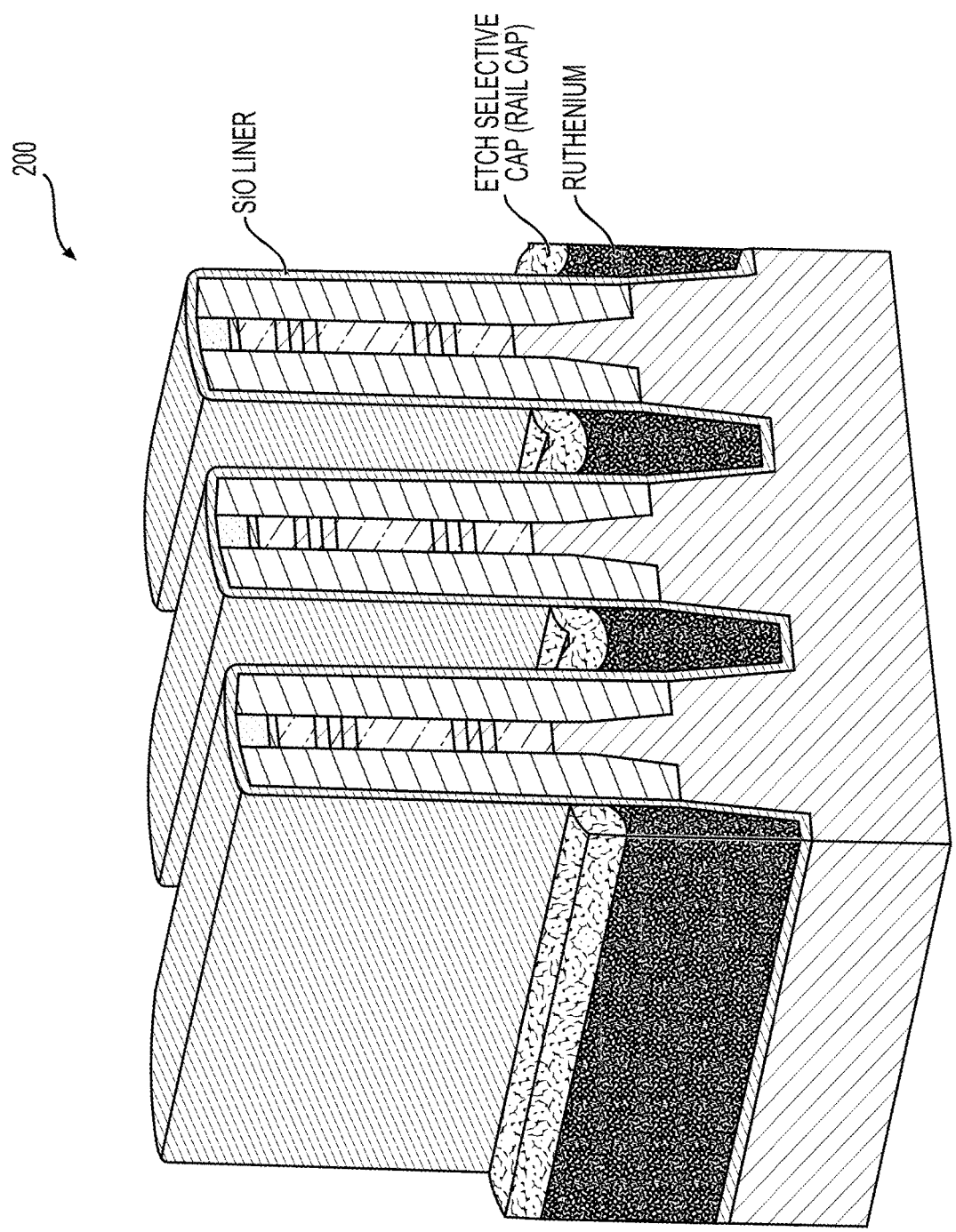

FIG. 29 shows a schematic view of the semiconductor device 200 after the etch selective cap is formed over the recessed ruthenium.

Figure 30:
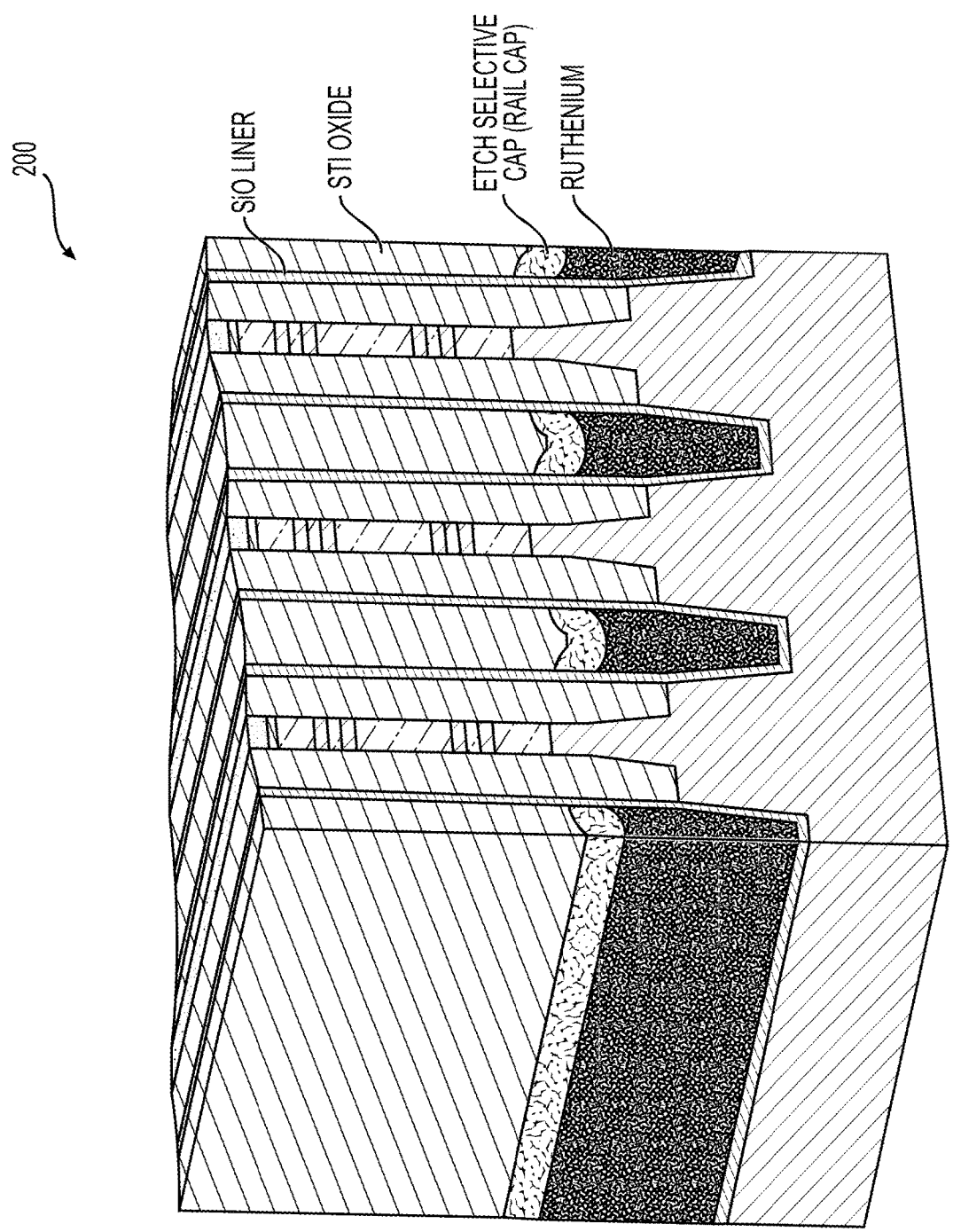

FIG. 30 shows a schematic view of the semiconductor device 200 after STI oxide is filled and polished down.

Further, similar processes described with reference to FIGS. 12-20 can be used to continue the manufacturing process on the semiconductor device 200.

It is noted that the semiconductor devices 100 and 200 are 3D devices with stacked devices. The operations for manufacturing the buried power rails can be integrated for regular FINFET without stacking. FIGS. 31-39 show various schematic views of intermediate stages for forming buried power rails for FINFET devices according to some embodiments of the disclosure.

Figure 31:
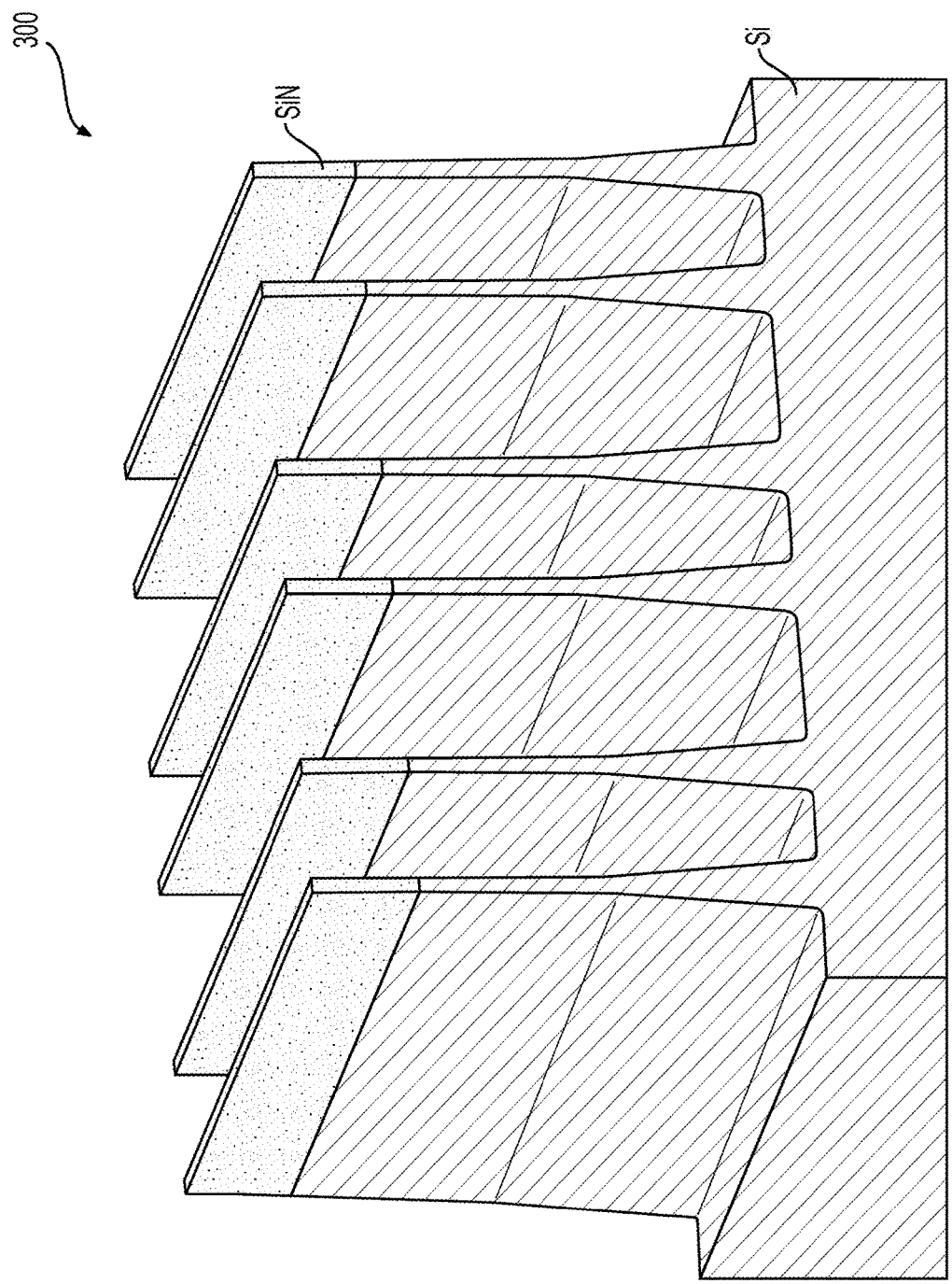
FIGS. 31-39 show various schematic views of intermediate stages for forming buried power rails according to some embodiments of the disclosure.

FIG. 31 a shows a schematic view of a portion of a semiconductor device 300 during a semiconductor manufacturing process according to some embodiments. In the FIG. 31 example, the Si FIN etch has been completed and a Pad oxide/SiN cap is left on the top of the FIN.

Figure 32:
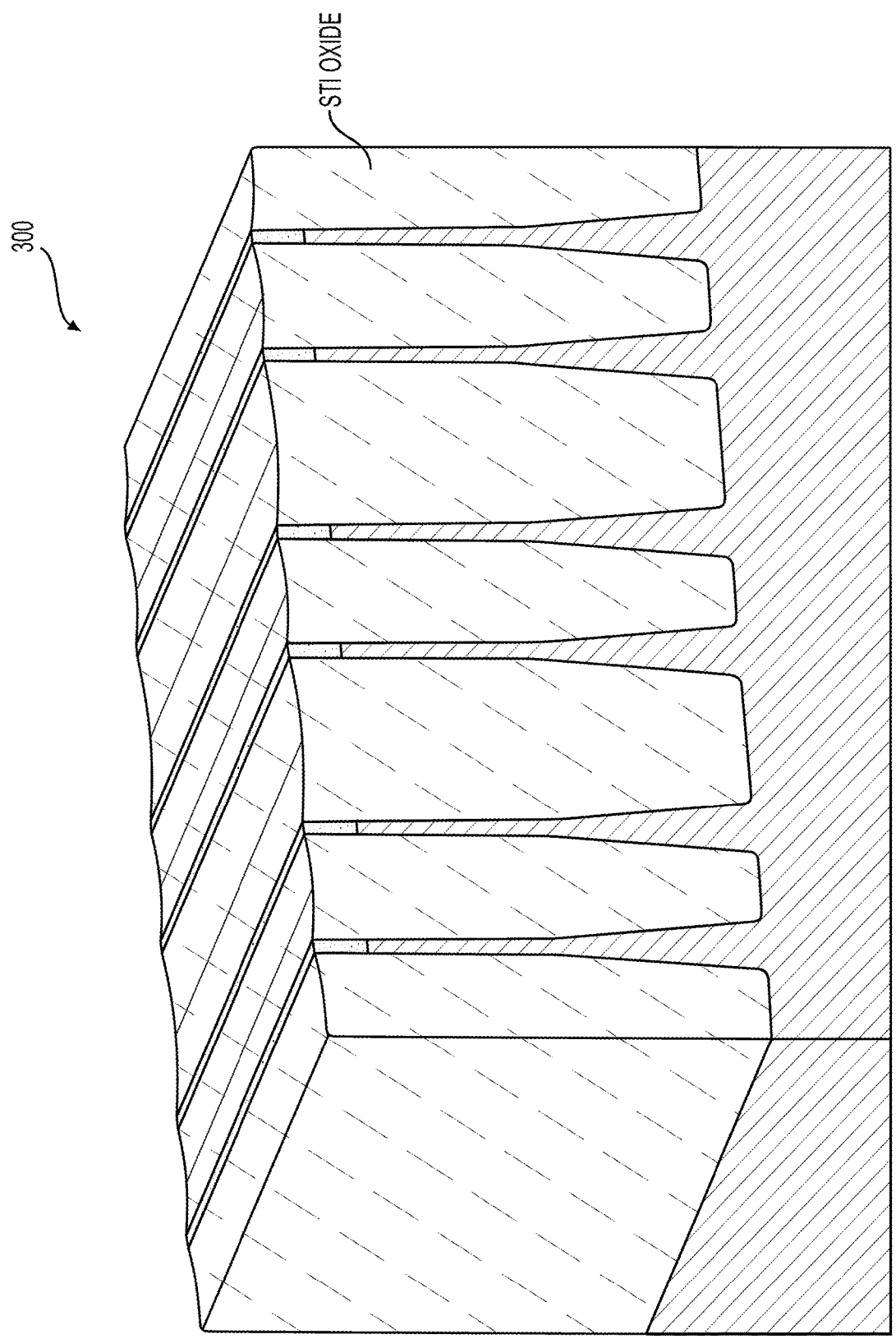

FIG. 32 shows a schematic view of the semiconductor device 300 after shallow trench isolation (STI) is done through deposition of oxide and CMP-back to the top of the Si/SiGe FIN structure.

Figure 33:
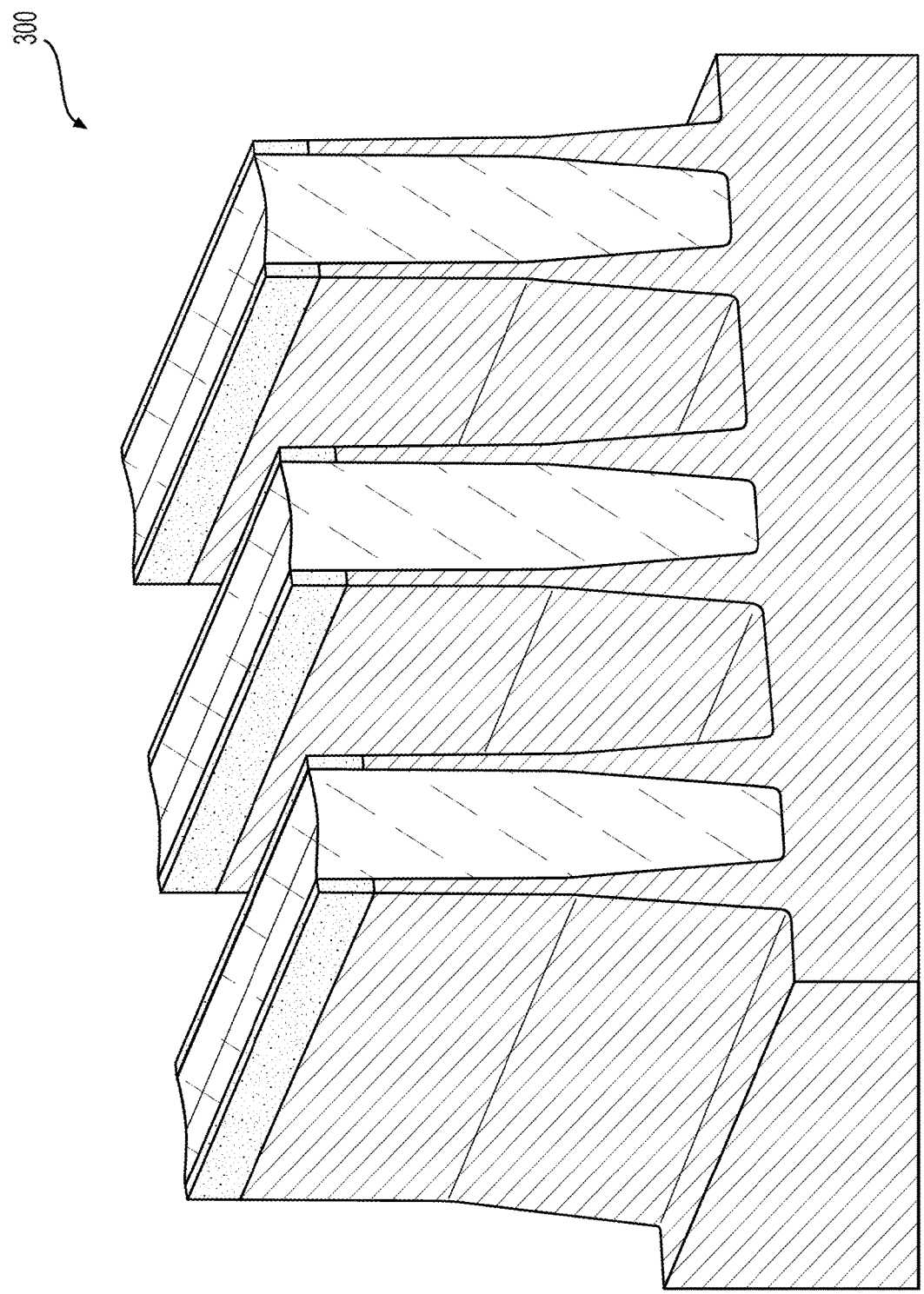

FIG. 33 shows a schematic view of the semiconductor device 300 when the patterns are transferred through the STI oxide for example by etching.

Figure 34:
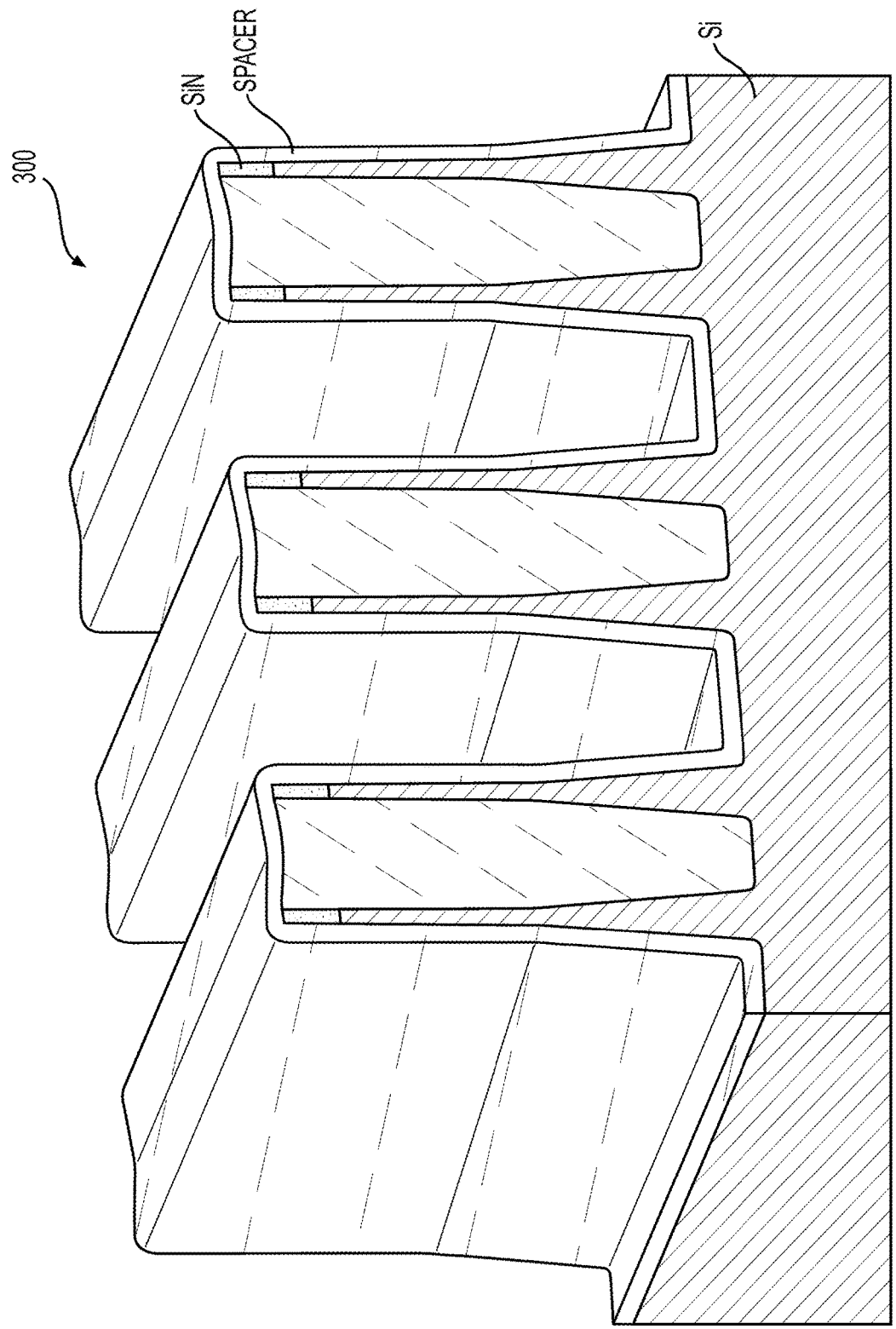

FIG. 34 shows a schematic view of the semiconductor 300 after a spacer layer is deposited. The spacer layer can assist the pattern transfer into the silicon through (a) ensuring that any opened silicon or SiGe fin structures are not etched during the transfer of the buried rail trench pattern into the bulk silicon and (b) ensuring through atomic layer deposition that there is a fixed and controllable distance between the eventual buried power rail and the silicon, SiGe, or silicon/SiGe fin structure.

Figure 35:
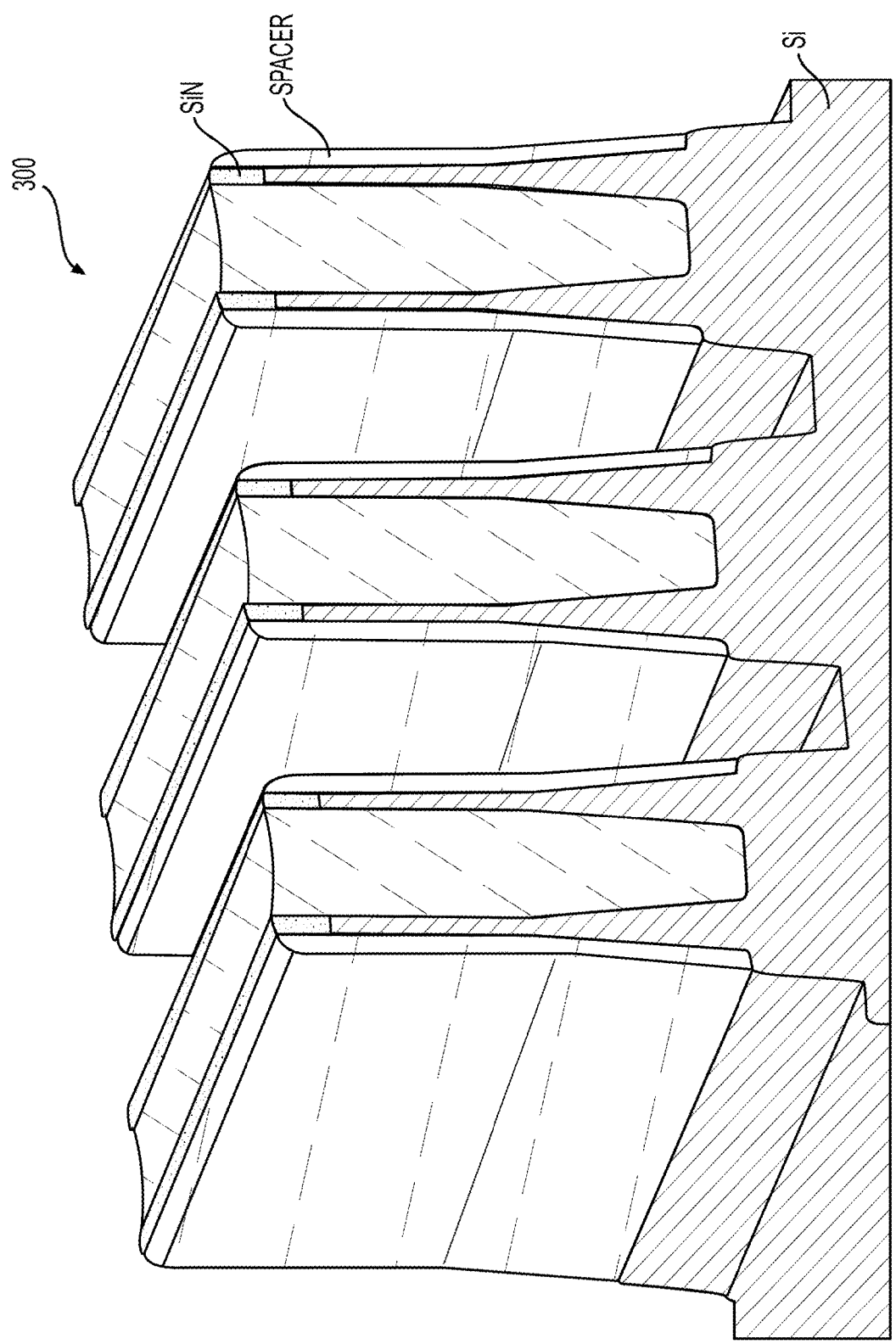

FIG. 35 shows a schematic view of the semiconductor device 300 when the patterns are further transferred into the bulk silicon.

Figure 36:
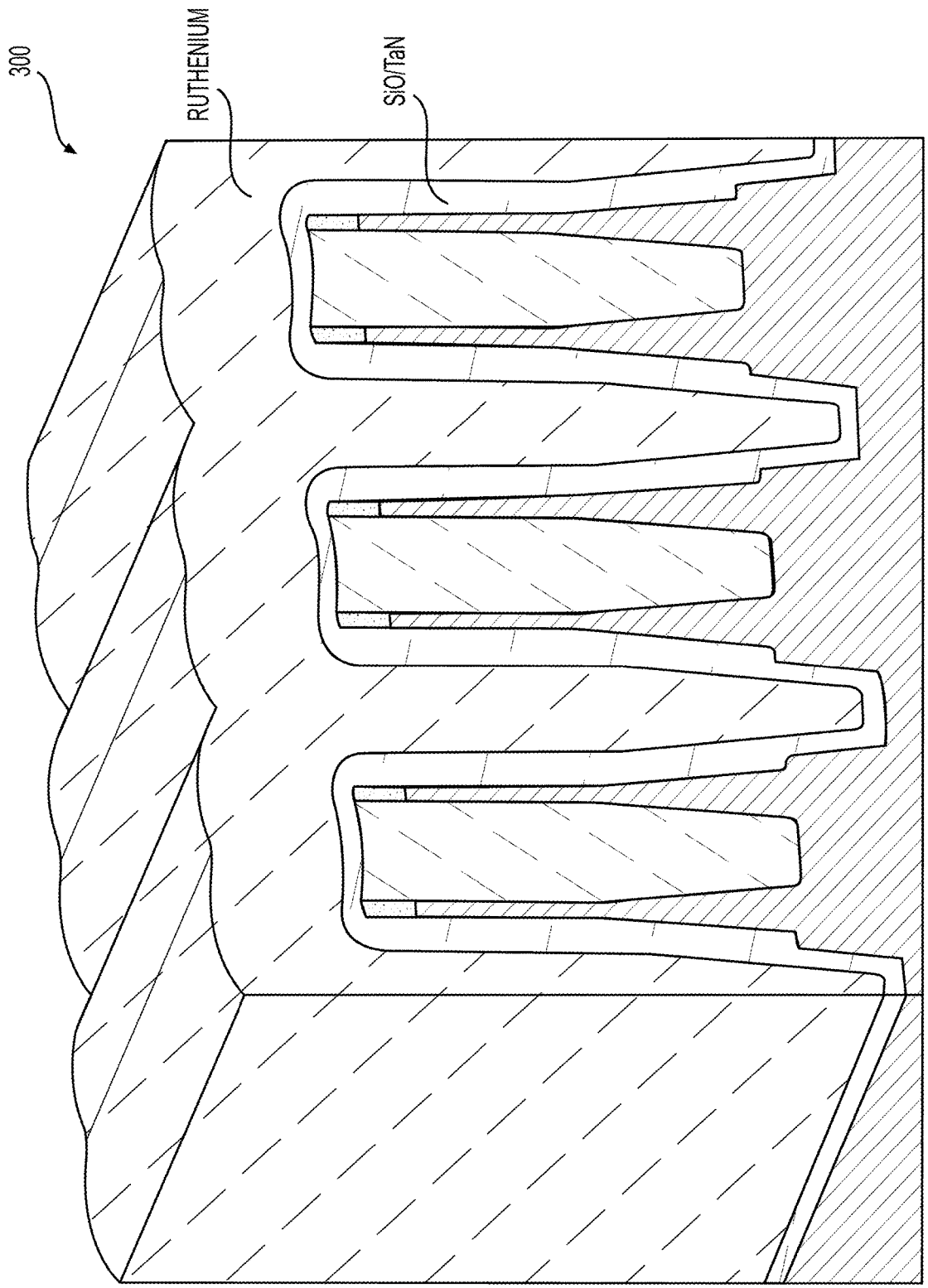

FIG. 36 shows a schematic view of the semiconductor device 300 when an etch-selective film, such as SiO/TaN liner, is deposited, and then the ruthenium is filled from the bottom of the trench.

Figure 37:
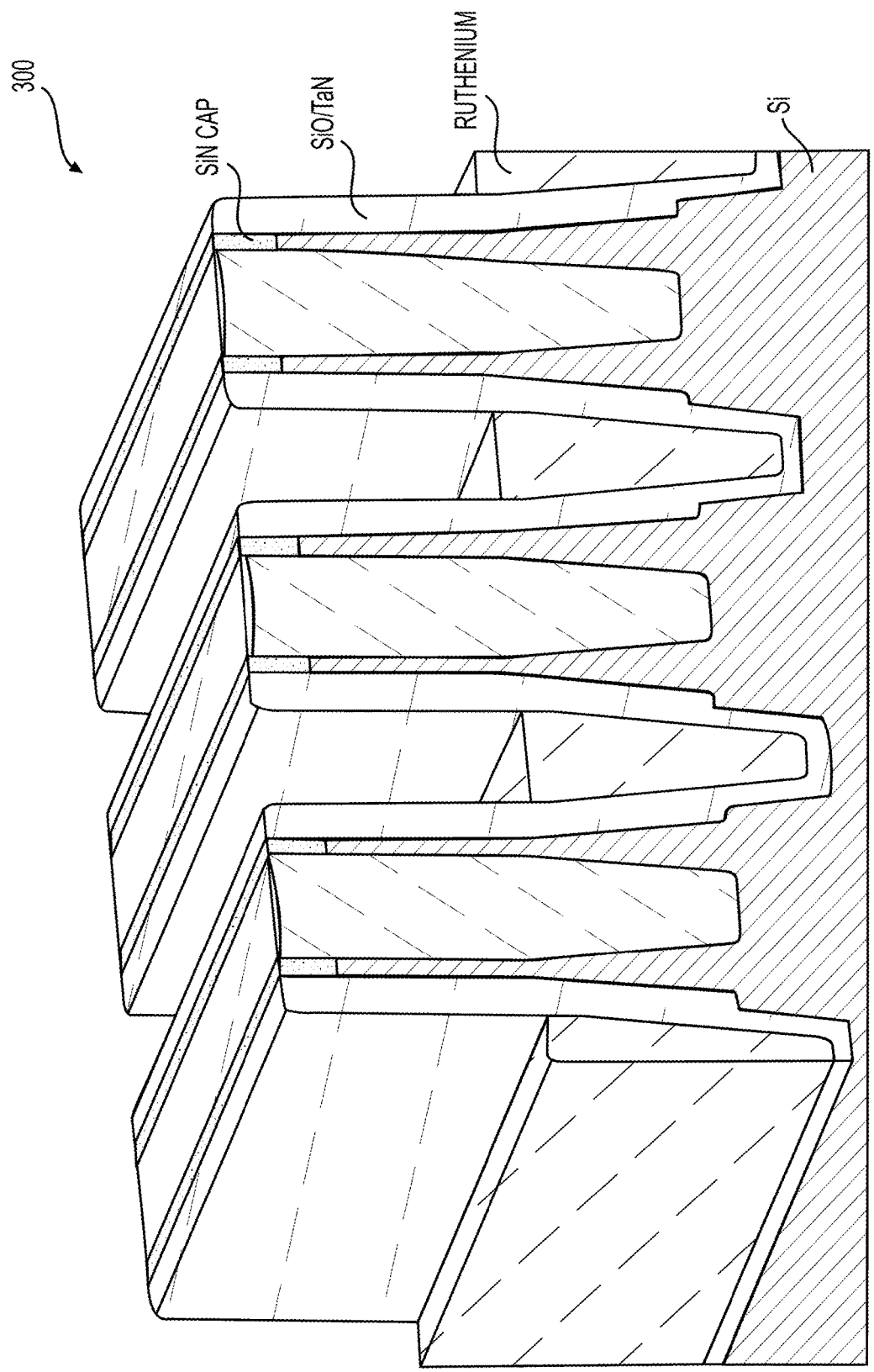

FIG. 37 shows a schematic view of the semiconductor device 300 after etching back the ruthenium. The ruthenium is etch-recessed in the rail trench of a specific depth. Further, the TaN in the liner is removed.

Figure 38:
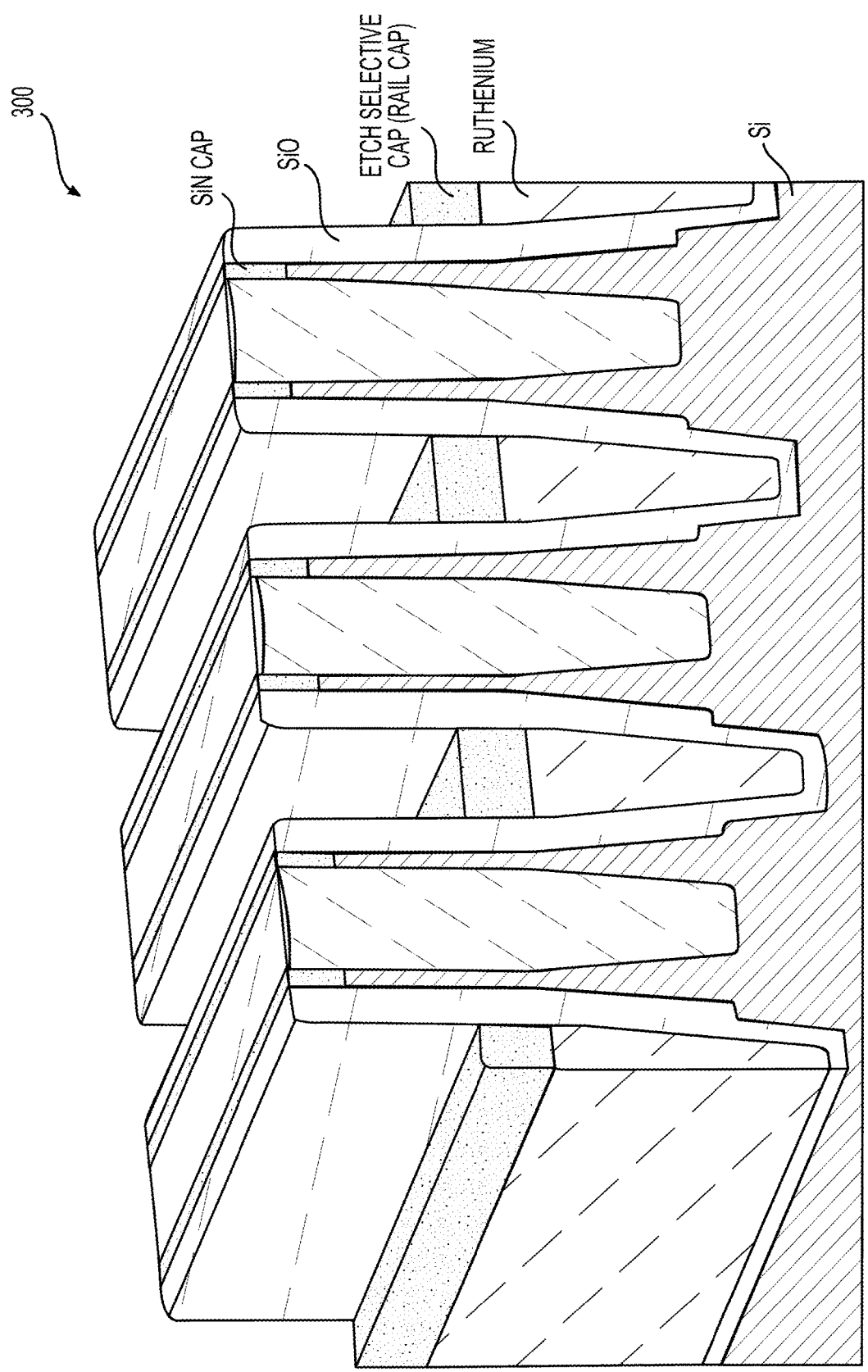

FIG. 38 shows a schematic view of the semiconductor device 300 after the etch selective cap is formed over the recessed ruthenium.

Figure 39:
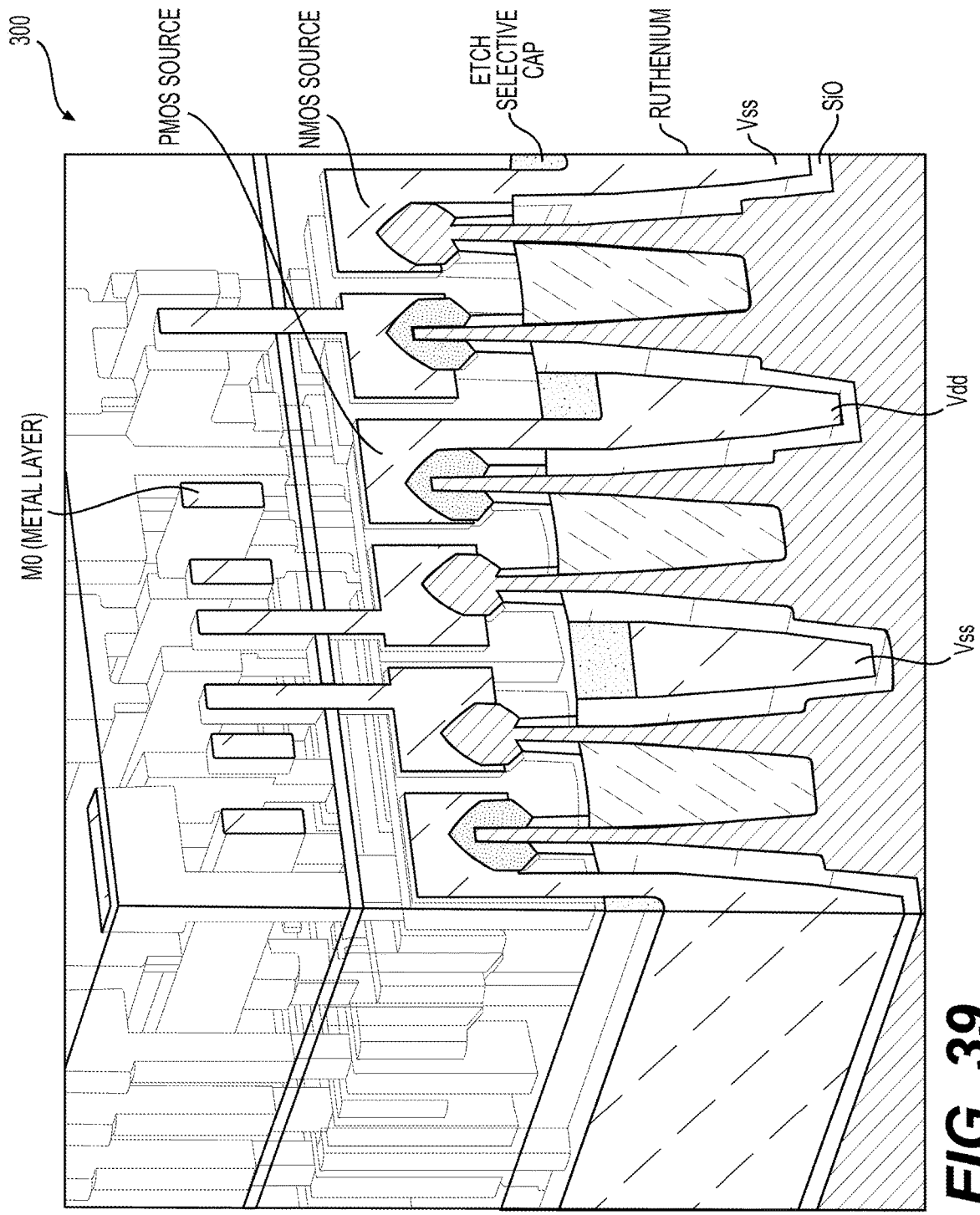

FIG. 39 shows a schematic view of the semiconductor device 300 after the wafer manufacturing process.

As noted the example embodiments herein focused on applications for buried power rails. This is just one example embodiment, techniques herein can be extended to cover any back-side wiring such as routing lines or local interconnect or cell-to-cell interconnect lines that exist below the physical device or transistor device.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a first power rail formed in a first rail opening within a first isolation trench;
a first dielectric cap on the first power rail within the first rail opening, the first dielectric cap isolating the first power rail from a conductive pattern structure on the first dielectric cap;
a second power rail having substantially a same thickness as the first power rail and being formed in a second rail opening within a second isolation trench;
a second dielectric cap on the second power rail within the second rail opening, the second dielectric cap being etch-selective to a side material of the second rail opening; and
an opening formed by etching the second dielectric cap that is etch-selective to the side material of the second rail opening and resulting in the opening having a side aligned with the second power rail, the opening being filled with conductive material that connects the conductive pattern structure with the second power rail.

2. The semiconductor device of claim 1, wherein the first power rail is formed within the first isolation trench, and the second power rail is formed within the second isolation trench.

3. The semiconductor device of claim 1, wherein the first power rail is formed through the first isolation trench and into a bulk silicon substrate, and the second power rail is formed through the second isolation trench and into the bulk silicon substrate.

4. The semiconductor device of claim 1, wherein the second dielectric cap is of a material that is etch selective to a SiO liner between the second power rail and the second isolation trench and oxide in the second isolation trench.

5. The semiconductor device of claim 1, wherein the first dielectric cap is selective-deposited on the first power rail.

6. The semiconductor device of claim 1, wherein the first and second power rails are formed of a metal material that has a thermal stability over 700° C.

7. The semiconductor device of claim 6, wherein the metal material is a refractive metal.

8. The semiconductor device of claim 7, wherein the first and second power rails are formed by filling the first and second rail openings with the refractive metal and etching back the refractive metal to a specific depth.

9. The semiconductor device of claim 6, wherein the metal material includes ruthenium.

10. The semiconductor device of claim 1, wherein an aspect ratio of the first and second power rails is pre-determined to meet a resistivity requirement of the first and second power rails.

11. The semiconductor device of claim 10, wherein a critical dimension width of the first and second power rails is pre-determined in conjunction with the aspect ratio.

12. A method for manufacturing a semiconductor device, comprising:
- forming, in a first rail opening in first isolation trench, a first power rail and in a second rail opening in a second isolation trench, a second power rail having substantially a same thickness as the first power rail;
- top-covering the first power rail with a first dielectric cap and the second power rail with a second dielectric cap, the second dielectric cap being etch-selective to a side material of the second rail opening; and
- etching an opening in the second dielectric cap that is etch-selective to the side material of the second rail opening, and resulting in a side of the opening aligned with the second power rail;
- filling the opening with conductive material to connect a conductive pattern structure with the second power rail through the filled opening, the first dielectric cap isolating the first power rail from the conductive pattern structure.

13. The method of claim 12, wherein forming, in the first rail opening in the first isolation trench, the first power rail and in the second rail opening in the second isolation trench, the second power rail further comprises:
- etching the first rail opening within the first isolation trench and the second rail opening within the second isolation trench; and
- forming the first power rail in the first rail opening within the first isolation trench, and the second power rail in the second rail opening within the second isolation trench.

14. The method of claim 12, wherein forming, in the first rail opening in the first isolation trench, the first power rail and in the second rail opening in the second isolation trench, the second power rail further comprises:
- etching the first rail opening through the first isolation trench and into a bulk silicon substrate, and the second rail opening through the second isolation trench and into the bulk silicon substrate; and
- forming the first power rail in the first rail opening that is in the first isolation trench and the bulk silicon substrate, and the second power rail in the second rail opening that is in the second isolation trench and the bulk silicon substrate.

15. The method of claim 12, wherein top-covering the first power rail with the first dielectric cap within the first isolation trench further comprises:
- selective-depositing a dielectric material as the first dielectric cap that is etch selective to a SiO liner between the first power rail and the first isolation trench.

16. The method of claim 12, wherein forming, in the first rail opening in the first isolation trench, the first power rail and in the second rail opening in the second isolation trench, the second power rail further comprises:
- forming the first power rail and the second power rail using a metal material that has a thermal stability over 700° C.

17. The method of claim 16, wherein forming the first power rail and the second power rail using the metal material that has the thermal stability over 700° C. further comprises:
- forming the first power rail and the second power rail using ruthenium.

18. The method of claim 17, wherein forming the first power rail and the second power rail using ruthenium further comprises:
- filling the first rail opening in the first isolation trench and the second rail opening in the second isolation trench with the ruthenium; and
- etching back the ruthenium to a specific depth.

19. The method of claim 12, wherein forming, in the first rail opening in the first isolation trench, the first power rail and in the second rail opening in the second isolation trench, the second power rail further comprises:
- forming a power rail that includes two rail lines.

20. The method of claim 19, wherein forming the power rail that includes the two rail lines further comprises:
- conformally depositing a spacer layer on sidewalls and bottom of a rail opening in an isolation trench;
- filling the rail opening with a dielectric material;
- removing the spacer layer formed on sidewalls of the rail opening to form two spacer-trenches;
- filling the two spacer-trenches with ruthenium; and
- etching back the ruthenium to a specific depth.

* * * * *